(12) United States Patent
Wolter

(10) Patent No.: US 9,252,311 B2
(45) Date of Patent: Feb. 2, 2016

(54) SOLAR PANEL SYSTEM WITH MONOCOQUE SUPPORTING STRUCTURE

(76) Inventor: James F. Wolter, Spring Lake, MI (US)

( * ) Notice: Subject to any disclaimer, the term of this patent is extended or adjusted under 35 U.S.C. 154(b) by 1363 days.

(21) Appl. No.: 13/035,117

(22) Filed: Feb. 25, 2011

(65) Prior Publication Data

US 2011/0303262 A1 Dec. 15, 2011

Related U.S. Application Data

(60) Provisional application No. 61/353,379, filed on Jun. 10, 2010.

(51) Int. Cl.
| | |
|---|---|
| *H01L 31/048* | (2014.01) |
| *H01L 31/05* | (2014.01) |
| *F24J 2/52* | (2006.01) |
| *H01L 31/042* | (2014.01) |
| *F24J 2/04* | (2006.01) |

(52) U.S. Cl.
CPC .............. *H01L 31/05* (2013.01); *F24J 2/523* (2013.01); *F24J 2/5237* (2013.01); *F24J 2/5239* (2013.01); *H02S 20/00* (2013.01); *F24J 2/0427* (2013.01); *F24J 2/525* (2013.01); *F24J 2002/5281* (2013.01); *Y02B 10/12* (2013.01); *Y02B 10/20* (2013.01); *Y02E 10/47* (2013.01); *Y02E 10/50* (2013.01)

(58) Field of Classification Search
CPC ..................................................... H01L 31/05
USPC ....................................................... 136/251
See application file for complete search history.

(56) References Cited

U.S. PATENT DOCUMENTS

| | | | | |
|---|---|---|---|---|
| 4,135,493 A | * | 1/1979 | Kennedy | 126/577 |
| 4,240,406 A | * | 12/1980 | Hutchison | 359/867 |
| 4,256,088 A | | 3/1981 | Vindum | |
| 4,297,003 A | | 10/1981 | Hutchison | |
| 4,313,422 A | * | 2/1982 | McEntee | 126/624 |

(Continued)

FOREIGN PATENT DOCUMENTS

| | | | | |
|---|---|---|---|---|
| JP | 09-053211 A | * | 2/1997 | H01L 31/042 |
| JP | 2008038495 | | 2/2008 | |

OTHER PUBLICATIONS

"P4P TenSol Systems," printed Mar. 16, 2011. http://www.p4penergy.com/systems.html. Copyright 2009 TenSol Power LLC.

(Continued)

*Primary Examiner* — Golam Mowla
(74) *Attorney, Agent, or Firm* — Price Heneveld LLP

(57) ABSTRACT

A solar panel system comprises a monocoque forming an enlarged solar-facing generally-convex outer support surface when in an installed position and that supports solar cells at optimal angles for capturing solar energy. The monocoque provides a stressed-skin support reducing weight while maintaining strength, optimal support surface, and minimizing cost. A post engages and supports adjacent edges of a pair of adjacent monocoques. An electrical circuit connects the solar cells for electrical flow and power management, and preferably includes a controller for controlling power from the solar cells, including combining them in series or parallel as optimal for a given systems configuration. The illustrated monocoque includes a roll formed sheet or a number of sheets, stacked vertically together and anchored to spaced posts using connectors in a "fence-like" pattern.

29 Claims, 13 Drawing Sheets

(56) References Cited

U.S. PATENT DOCUMENTS

| | | | |
|---|---|---|---|
| 4,348,797 | A | 9/1982 | Hutchison |
| 4,348,798 | A | 9/1982 | Hutchison |
| 4,372,027 | A | 2/1983 | Hutchison |
| 4,372,651 | A | 2/1983 | Hutchison |
| 4,423,719 | A | 1/1984 | Hutchison |
| 4,620,771 | A | 11/1986 | Dominguez |
| 4,716,258 | A | 12/1987 | Murtha |
| 5,092,512 | A | 3/1992 | Sturrus et al. |
| 5,408,990 | A | 4/1995 | Edling et al. |
| 5,454,504 | A | 10/1995 | Sturrus |
| 5,517,358 | A | 5/1996 | Dominguez |
| 6,559,371 | B2 | 5/2003 | Shingleton et al. |
| 6,959,993 | B2 | 11/2005 | Gross et al. |
| 7,192,146 | B2 | 3/2007 | Gross et al. |
| 7,703,246 | B2 | 4/2010 | Chang |
| 2006/0207192 | A1 | 9/2006 | Durham |
| 2008/0210289 | A1 | 9/2008 | Chen |
| 2009/0188546 | A1 | 7/2009 | McGlynn et al. |
| 2009/0251811 | A1 | 10/2009 | Wright |
| 2009/0272846 | A1 | 11/2009 | Anast et al. |
| 2010/0117623 | A1 | 5/2010 | Fife et al. |

OTHER PUBLICATIONS

"Wave SOL," printed Mar. 16, 2011. http://www.ascentsolar.com. dated Jun. 2011 Ascent Solar Technologies, Inc.

"PowerFLEX BIPV," printed Mar. 16, 2011. http://www.globalsolar.com. Copyright 2009 Global Solar Energy, Inc.

"DOW Powerhouse Solar Shingles Receive UL Certification," printed Mar. 16, 2011. http://www.globalsolar.com/en/press/in-the-news/101-dow-powerhouse-solar-shingels-rec . . . dated Nov. 26, 2010. Dow Solar.

"Energy Conversion Devices," printed Mar. 16, 2011. http://www.energyconversiondevices.com/ Copyright 2011 Energy Conversion Devices.

UniRac, Inc., "The face of PV Integration," Pub No. 060731-1os, Jul. 2006, Albuquerque, NM.

* cited by examiner

SOLAR PANEL SYSTEM WITH MONOCOQUE SUPPORTING STRUCTURE

CROSS REFERENCE TO RELATED APPLICATION

This application claims benefit under 35 U.S.C. Section 119(e) of provisional application Ser. No. 61/353,379, filed Jun. 10, 2010, entitled SOLAR PANEL SYSTEM WITH MONOCOQUE SUPPORTING STRUCTURE, the entire content of which is incorporated herein in its entirety.

BACKGROUND OF THE INVENTION

The present invention relates to photovoltaic (PV) solar panel systems, and more particularly relates to a PV-solar panel system with stressed-skin, monocoque supporting structure that functions to optimally position the solar panels for receiving sunlight as the sun's position changes in its daily transit from east to west, but that also minimizes weight, cost of materials, installation costs, and capital investment of such systems by incorporating a monocoque-mounting structure fabricated from relatively thin, curved materials which eliminates most of the skeletal support structures required in planar mounting of photovoltaic materials common to known solar installations.

Solar-electric systems installations are expensive not only because of the costs of the solar cells/panels themselves and balance of system components, but also because of the costs to acquire and install the underlying physical-support structures they require. In common practice, solar-electric panel systems (photovoltaic arrays) use structural metal beams to provide the physical support for the active, electricity generating solar materials so that the photovoltaic materials are supported at optimal angles to the sun, having optimal spacing in an array/field of solar panels, and creating the designed physical mounting strength to meet weight and wind-load and environmental requirements for the installation.

Further, many solar panel systems include pivot-and-tracking mechanisms so that solar panel modules can be continuously oriented toward the sun as it tracks across the sky. However, these tracked-arrays represent the highest cost approach to mounting PV-materials because the heavy gauge structural support frames and pivot-and-tracking mechanisms are expensive to buy, install, operate, and maintain. While these "tracking" PV systems may provide the absolute maximum generating power for a given number of framed PV-panels, their overall higher initial cost and potential for failures in the tracking mechanisms may detract from their competitiveness for solar panel systems as compared to the fixed-orientation solar installation described herein.

BRIEF SUMMARY OF THE INVENTION

In one aspect of the present invention, a modular solar panel system includes a plurality of monocoques defining a curved shape and including at least one solar panel on the curved shape, a plurality of posts with opposing sides engaging and supporting a vertical side edge of the monocoques, and an electrical circuit interconnecting the solar panels for electrical flow and power management.

In another aspect of the present invention, a solar panel system includes a monocoque formed from a curved panel including an exterior curved support surface facing toward the sun when in an installed position, and an electrical circuit including a plurality of solar cells supported on the support surface and interconnected for electrical flow and power management.

In another aspect of the present invention, a modular solar panel system having a stressed skin support structure including at least one sheet defining a curved shape where strength derived from the curved shape assists in self-maintaining the shape in a plurality of directions, the at least one sheet defining an enlarged outwardly-facing support surface, and a plurality of solar cells supported on the support surface.

In another aspect of the present invention, a solar panel system includes a panel structure having opposing edges and a support surface between the opposing edges, and a pair of upright supports each with a longitudinal slot slidably engaging one of the opposing edges, the supports being configured to hold the panel structure in a working fixed position where the support surface is at a desired solar incidence angle. The system further includes an arrangement of solar cells on the support surface, and a circuit connecting the solar cells for electrical flow and power management.

In another aspect of the present invention, a solar panel system includes a plurality of units arranged in a row with vertical side edges of adjacent pairs of the units being aligned and near each other, each unit including a stressed-sheet support structure with a curved surface between the vertical side edges, and further includes at least one solar cell on the curved surface. The system further includes a plurality of posts, each having first and second opposing surfaces engaging and supporting the first and second vertical edges of the adjacent units, respectively, whereby thermal expansion of the units is taken up in part by a change in a curvature of the units and/or a designed-in allowance for slippage, such as within the receiving channel of the mounting post.

In another aspect of the present invention, a solar panel system includes an alternating interconnected assembly of solar-cell-supporting monocoques and posts forming a continuous fence-simulating pattern, with each of the posts engaging adjacent vertical edges of an adjacent pair of the monocoques. The monocoques each include at least one solar-cell on a curved area of the monocoques, and a circuit is connected to the at least one solar cell. By this arrangement, thermal expansion of the system is taken up at least in part by slippage at the mounting post attachment, such as within a channel of the mounting post, and/or by a changing shape of the curved area as the system thermally expands and contracts.

In another aspect of the present invention, a solar panel system includes a plurality of solar-cell-supporting curved structures having vertical edges, each including a solar-cell-supporting curved area not lying on a plane connecting the vertical edges; the plurality of curved structures forming a continuous non-linear line where thermal expansion of the system is taken up by a changing shape of the curved areas and/or by the sum of the designed-in slippage tolerance distributed across the plurality of monocoques and posts, as the system thermally expands and contracts.

In another aspect of the present invention, a solar panel system includes a solar panel supporting structure with opposing vertical edges, posts configured to be secured in ground in an upright position, the posts having opposing surfaces each forming a longitudinal slot slidably receiving the vertical edges, and fixing connectors for securing the vertical edges to the posts. By this arrangement, installation is accomplished by securing the posts in the ground, sliding the vertical edges of the solar panel into the associated opposing surface of the posts, and securing the monocoque and each post together with the fixing connectors; thereby mechanically securing one complete monocoque solar surface to its opposed mounting posts.

In another aspect of the present invention, a method of constructing a solar panel system comprises steps of: providing a solar panel supporting structure with opposing vertical edges, and also providing posts configured to be secured in ground in an upright position, the posts having opposing surfaces each forming a longitudinal slot for slidably receiving one of the monocoques, securing the posts in the ground, sliding the vertical edges of the monocoques into associated channels of the opposing surfaces of the posts, and securing the vertical edges of the solar panel and the posts together.

In another aspect of the present invention, a method of forming a solar panel system, comprises steps of: forming a sheet to form a monocoque including a curved sheet portion with an outer convex surface and at least one stiffener in the sheet portion for strength; supporting an arrangement of solar cells on the outer convex surface, and forming a control circuit including attaching electrical conductors to the solar cells.

In another aspect of the present invention, a method comprises steps of: forming a stressed skin support structure including an outer sheet portion having an enlarged outwardly-facing support surface, attaching and supporting a plurality of solar cells on the support surface, and attaching electrical conductors from the solar cells to a control circuit for electrical flow and power management.

An object of the present invention is to provide a fixed installation that minimizes manufacturing and installation costs, while allowing optimization of the system's aiming angle(s) for receiving solar power throughout a day, doing so without requiring tracking or movement of its solar panels and without requiring massive supporting framework.

An object of the present invention is to utilize a monocoque structure to reduce the cost of mounting systems for photovoltaic systems to as little as 15% of the total costs of the installation, as compared to conventional steel structural mounting utilizing beams which can be 25%-35% of the total installed-system's cost. For example, my estimates show that one solar product company now would spend about $0.80 to $1.20 per watt for mounting their flexible solar laminates in ground mount installations, while the present monocoque system would do so in the $0.30 per watt range. Additionally, the present monocoque system would greatly reduce on-site preparation costs and greatly reduce installation costs.

An object of the present invention is to use a monocoque to both provide a sub-frame to support a solar panel system and also provide a curved shape to hold the solar panels.

An object of the present invention is to provide a rapidly deployable solar power system that can provide significant and reliable solar power, yet at reasonable cost and very quick set up times.

An object of the present invention is to provide a monocoque supportive frame that both stabilizes a flexible solar PV film and also presents the flexible solar PV material for use on a self-shape-holding structure without the need for additional skeletal framework.

These and other features, advantages, and objects of the present invention will be further understood and appreciated by those skilled in the art by reference to the following specification, claims, and appended drawings.

DETAILED DESCRIPTION

Figure 1:
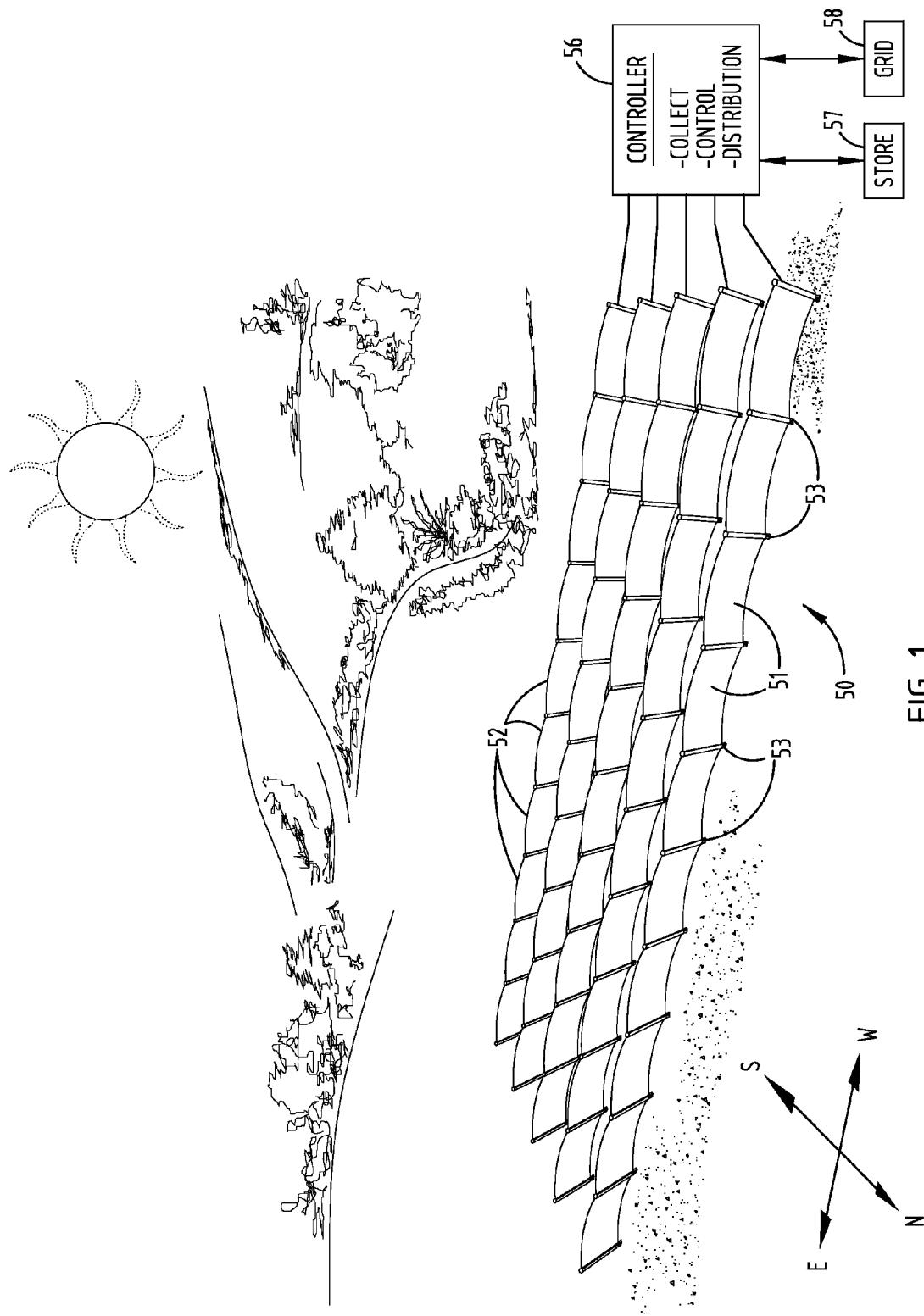
FIG. 1 is a rear perspective view of a ground-mounted solar panel system embodying the present invention, including several parallel rows of monocoques positioned edge to edge and each supporting a solar panel, and with posts supporting adjacent monocoques.

The present solar panel system includes a plurality of monocoques (also called a "monocoque support structure" or "solar-panel-supporting structure" or "curved frame" herein) each having a curved outer surface formed by thin sheet material, thin film solar panels with a plurality of solar cells on the outer surfaces, a plurality of posts (also called "anchoring system" or "upright monocoque supports" or "mounting standards" herein) configured to matably engage, hold, and anchor sides of the monocoques in a fence-like pattern, and an electrical circuit connecting the solar cells for electrical flow and power management. In a field installation, a post is positioned between each adjacent pair of monocoques, with the opposing sides of each post supporting the adjacent side edges of the pair of monocoques. The posts are extended into the ground at a desired angle and a specified spacing between posts to support the solar cells on the monocoques at an optimal solar collection angle. Stress-distributing connectors (also called "locking clips" or "mechanical stress-distributing attachment brackets" herein) are used to secure the vertical side edges of the monocoques to the posts. By this arrangement, a solar panel system can be quickly installed and constructed with reduced capital investment in support structure over traditional support systems, reduced capital investment in site preparation and installation over traditional support systems, reduced capital investment in maintenance and repair over traditional systems, and yet with increased flexibility of design and customization to meet the needs of various installations.

The illustrated monocoque is a stressed-skin support structure or curved frame construction in which the outer skin construction carries all or a major part of the stresses. (See definition of the term "monocoque" in Webster's Ninth New Collegiate Dictionary, © 1991 by Merriam-Webster Inc.) In a preferred form, the present monocoques are self-shape-holding rigid structures that take advantage of the curved shape of a thin sheet of structural material to help form the rigidity. As will be understood by an artisan or structural engineer familiar with such structures, the sheet takes on considerable strength when it is curved, thus reducing overall weight while maintaining structural integrity and stiffness. The posts support opposing vertical side edges of the monocoques, adding to and supplementing the structural integrity and stiffness of the overall system. In particular, the illustrated Mono-Mount™ system of posts is a low cost, multi-function, integrated solution to meeting the requirements for mounting flexible, thin-film photovoltaic (PV) materials in solar power systems. In its various embodiments, the posts may be ground mounted or roof-top mounted, and can be used to accept and support various sized flexible or inflexible PV-laminate or crystalline materials. By this arrangement, it can be used to deploy solar photovoltaic electrical generation installations in small power PV-systems or in large multi-megawatt-peak PV-power projects, as described hereafter. Also, the need for an extensive supportive framework with beams is eliminated.

While the present Mono-Mount™ system is ideally suited to mount a growing number of factory-made flexible, light weight PV-laminates employing various chemistries and substrate materials, it is contemplated that a scope of the present invention includes future technical breakthroughs which will emerge. For example, it is contemplated that a scope of the present invention will include advancements that allow direct deposition of photoactive materials on a metallic or metalized polymer substrate, where the substrate has mechanical properties sufficient to function as a monocoque and function as a solar-cell-mounting substrate, whether the final material is curved before or after the photoactive surface is deposited. In particular, it is contemplated that a scope of the present invention includes the use of any curved surface structure where the curved surface structure contributes to the overall structural integrity of the final solar mounting product, particularly when used without continuous sub-structural support, such as beam frames.

A significant difference between the present Mono-Mount™ system 50 and conventional framed-structure PV mounting systems resides in the fact that the present Mono-Mount™ system uses curved, thin-gauge materials (steel, aluminum, other metal, polymeric, or composite, such as steel or aluminum sheet having a thickness of 1-6 mm and a tensile strength of 20+ ksi, or more preferably 60+ kis) as mounting surfaces applied in stressed-skin, monocoque configuration. The present monocoque structures are captured between dual-facing posts, and thus eliminate a substantial amount of skeletal support structural elements required to mount conventional, framed solar panels. The additional weight savings of using thin film solar laminates over framed crystalline PV-panels stems from their 2 to 1 weight savings on a per-watt installed-weight basis because crystalline cell panels are inherently heavier than thin-film-photovoltaic materials by a factor of two. For example, the present thin film can be about 2-6 mm thick. This also contributes to the cost savings of using monocoque mounting of thin-film-PV materials on materials costs, shipping, and handling costs, and installation cost differences between the types of solar panels used and the resulting choice of mounting methods. The resulting systems' cost savings favor the use of monocoque structures matched with thin-film, light weight flexible PV-laminates in a least-total-system's cost tabulation.

Monocoque PV-mounting surfaces may be made from a single sheet of metal, reinforced polymer, or composite materials fabricated into a simple or complex curved surface so as to provide the mounting substrate for flexible PV-laminates or directly deposited solar photovoltaic materials. The resulting solar collector may be oriented such that an edge or its curved surface is parallel to or perpendicular to the earth's surface or positioned at any rotated angle between. It is contemplated that a monocoque as used herein may be made from alternative constructions. For example, a monocoque may be made of a single sheet of foam with paper or metallic "skin" on front and rear faces. Notably, the preferred monocoque is curved longitudinal shape, such that it is curved about a single axis and is linear in a direction perpendicular to the single axis. Longitudinal channel ribs may be formed therein that extend along the curvature for increased stiffness of the monocoques. It is also contemplated that the monocoque can be bent to have a simple curvature (i.e. to have a changing curvature in a single plane, such as a right-angled cylindrical chord) or to have a complex curvature (i.e. to be curved in multiple planes).

Notably, the monocoque may be made from a single sheet of material or can be made from several curved sections attached together. The monocoque can be any size desired, depending on the particular functional requirements of an installation. For example, outdoor monocoques used in fields of solar panels can be 6 feet high by 9 feet wide, and curved to a convex shape of between about 20-30 degrees of a circular arc, such as about 12 to 18 inches deep at its center. When made from several curved sections attached together, they may be stacked or affixed together. For example, the several curved sections can be 16 inch wide pans joined at edges to create a "solid" curved surface. The several curved sections also may be held by spaced posts to create a cumulative curved surface for holding the solar panels, with both the posts and the monocoque contributing structural strength to the assembly to maintain an assembled shape.

Figure 10:
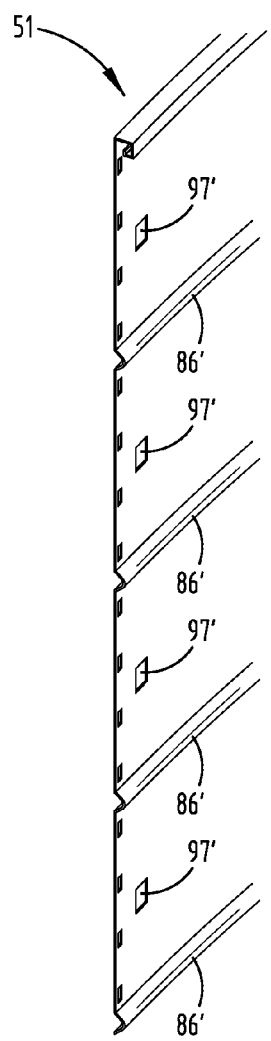
FIGS. 10-10B are perspective views showing alternative monocoque constructions.

The illustrated monocoque in FIG. 10 is made from a single sheet and is ideally suited for mounting "peel and stick" flexible, thin-film PV laminates. However, it can adapt to any PV material which can be sectioned in small enough dimensions so as to follow the curved surface from end to end (such as inflexible ceramic tile used in a mosaic may be made to follow a curved path so long as its dimension does not prevent the use of a continuous adhesive medium). There are several examples of thin width but long length crystalline solar cells that could readily be mounted "vertically" on a curved surface making the resulting solar panel double as a mounting structure. For example, the thin-width but long-length solar cells could be mounted vertically on the monocoque panel.

Typically, curved sections prepared for use in monocoque structures will have integral-reinforcing to increase its total mechanical strength. For example, a metallic sheet may be roll formed into a curved structure using tooling that simultaneously forms grooves and/or flanges and/or patterns of indentations which give the surface lateral stiffness to meet the mechanical requirements for the final structure. Any such stiffening forms may be positioned so as to be between laminates or under laminates so as to not interfere with the bonding of the PV laminate with the monocoque substrate. It is contemplated that additional stiffeners could be adhered or fastened to the monocoque structure as well.

Another embodiment of monocoque structures may be a laminated structure, either metallic or composite, where curved-skin materials (front and rear surfaces) are separated by inner core strengthening materials which are bonded to both surfaces. Such construction will include some way of affixing individual panels together at the seams, or may include stacking them together with interlocking flanges, which may be hemmed or fixed such as with adhesives, or stacking them together using posts to maintain alignment and for edge strengthening.

This present system incorporates a novel, multi-functional mounting system including post(s) and locking connectors (also called "clips" herein). The post consists of a pre-stamped, roll-formed "Capture-Mount™" mounting post which can be driven in the ground where soil conditions permit or cemented into predrilled holes where soils are fouled with debris (in a remediation site for example) or where soils are rocky or are even solid rock.

A first functional-novelty of these posts is that they will be dual-facing, allowing each post to capture the vertical side edge of an adjacent pair of monocoque solar surfaces (one going left—the other going right). This reduces material and installation costs by cutting in half the number of mounting posts. Thus, the Mono-Mount™ system requires substantially less material and less installation time and manpower over conventional structural-steel, erector-set systems which must use at least twice as many driven posts for weight bearing and thermal expansion compensation reasons.

A second novelty of these posts (and also of the monocoques with curved shapes) is that they enable a built-in tolerance for thermal expansion of the system, both due to tolerances in the locking mechanism and also due to the monocoque's shape. Specifically, when installing long rows of solar panels, there must be spacing between conventional mounting-structures to accommodate thermal expansion between cold and hot environmental changes (daily or seasonally). In contrast, the present Mono-Mount™ system has two mechanisms to absorb thermal expansion. The first is an inherent slip-joint effect within the capture of the mounting posts, allowed by the dimensions of the edge-capturing connectors, where the slip-joint effect allows a designed tolerance of lateral thermal growth or contraction of the groups of panels tied together in a single row. The second is an ability for the curved system to have a designed-in spring function to allow a controlled deformation in long, series line-ups of Mono-Mount™ structures. (In other words, the curved shape of the monocoques can change curvature slightly to accommodate thermal expansion along a given row.) The combination of these two effects will allow continuous, interconnection of the present monocoque system is limited only by other location-specific requirements, such as roadway breaks throughout the solar farm, or geographic reasons such rivers, trees, rock ledges, and/or for as esthetic appearance choices by solar architects designing a given site/installation.

A third novelty of this mounting system is that while still "in the flat," the material which will be formed into the mounting posts can be punched to allow several functional features. Punched retainer holes can be formed in the flat such that they end up strategically located to accept the stress-distributing connectors which will be forced into the cavity between the post and the end of the solar collector to fix the vertical side edges of monocoques to respective posts. The connectors include "fish-hook-like" resilient spring tabs that align with the punched retainer holes and that snap through the retainer holes to secure the solar collector and the mounting posts together. The connectors are designed to prevent separation of the monocoques from the posts and to withstand forces from wind loads, while allowing some slippage to compensate for thermal expansion. It is noted that the monocoques can be secured to the posts via a number of different ways, and that while the preferred connector is illustrated, it is also contemplated that other fastening means may be used, such as threaded fasteners, non-threaded fasteners (such as rivets, push-in clips, snap-in and friction-fit fasteners), and other mechanical fasteners (such as brackets with hooks). It is also contemplated that a scope of the present invention includes other attachment systems, such as adhering means, welding, or crimping.

A fourth novelty of this system is that the posts can have a pre-dimensioned hole which allows the insertion of a bottom-of-the-panel locating pin which when employed will allow the timely insertion of the solar collecting panels into the driven end posts exactly lining up the holes in the panels with the holes in the posts and thus allows for the quick insertion of the locking clips tying the system mechanically together.

A fifth novelty of this system is embedded in the ability to form integral functional features in the curved monocoque structures. For example, a formed and semi-enclosed back-flange can be formed along a top of the monocoque sheet, with the back flange being under-bent sufficiently to form a covered upfacing wireway channel along the top edge. It is noted that the back flange/wireway must be configured to accommodate posts at its ends by aligning the wireways with preformed holes in the inner-flanges of the mounting posts for passing hidden-wiring through adjacent monocoques. The covered wireway provides protection from weather and outdoor elements, yet allows wires to be routed along rows of the monocoques, and further allows the wires to be pulled for convenient inspection and repair of plug-in connectors. It is noted that solid, enclosed conduits are not desired because they prevent inspection. However, the present curved or semi-rectangular cross section will both allow easy access to passing wires and connectors while providing environmental protection for the electrical connection-system.

A common configuration for wiring in large PV-farms requires long series connections of low-voltage panels to build the total operating voltage of such strings-of-panels. At present, the National Electrical Code is being changed to increase the upper limit of PV-string-voltages from 600 vdc to 1,000 vdc. A likely embodiment of the Mono-Mount™ system described herein would be to use 4-PV-series connected laminates on each monocoque to create a 50 volt DC solar power unit, 500 wp each—then to use 21 mounting posts to deploy 20 such electrically-interconnected structures in a line to create the desired 1000 vdc system offtake voltage with a power rating of 10 kwp (see FIG. 13).

In such a series-chain connection—except for the first (#1) and last (#20) monocoques, the electrically positive connection on each monocoque plugs into the electrically negative connection on the next monocoque in this illustrated 20 monocoque row. With the wireway formed in the top of each monocoque described in this fifth novelty interfacing with preformed holes in the interior slot of the mounting posts, it becomes convenient to bring the single connecting wire necessary to complete the 20-structure series-circuit back through the interior of the posts and wireway channels in each monocoque. For clarification—for the first monocoque in a line of 20—only one connection to the next monocoque can be made in series-electrical connection (say the positive lead in this example leaving the negative lead in the first monocoque temporarily unconnected). Whereupon the second and every succeeding monocoque will have both negative and positive leads connected (one to the positive connector on the previous monocoque and the other to the negative connection on next monocoque). Then the $20^{th}$ monocoque, like the first, will only be connected to the previous 19 by its negative lead—therefore requiring one run of a single conductor along the wireways in all 20 monocoques, through the interior of the mounting posts to be connected to the beginning (#1) negative lead. Only in this way will both the positive and negative 1000 vdc power be electrically present at a single point (#20). This location will commonly use a "1000 vdc combiner-box" for convenient integrative, parallel connection of multiple strings to the larger system of multiple such rows. These combiner boxes can readily be configured to mount on the end-posts of each string, and where codes permit, could provide an inner-post passage down to underground wiring or up to overhead wiring.

A sixth novelty of this system involves interconnection of wires between monocoques at the location of the posts. The present posts are designed with an enlarged bulbous channel location between the oppositely facing channels that receive the vertical side edges of adjacent monocoques. The enlarged bulbous channel forms a cavity for housing wiring and wiring connectors from the solar cells. Access holes are pre-punched into the blank before forming the posts, such that the access holes end up at strategic locations to accept the power output wire of each PV-element when the post is roll formed. A grommet can be snapped into the holes to prevent sharp edges of the post material from damaging the insulator of the wires. The grommet can also help resist moisture intrusion through the access holes, and can provide resilience to allow insertion of the wire connectors through the access holes while providing a minimum clearance to the electrical wiring. A boot-like top cover or cap is used to cover a top of the posts and a slip-on linear cover can be installed to close the open-back of the posts from ground to top of the post, thus maintaining closure of the wire-containing cavity in the post from the weather and outdoor elements. It is noted that the cover can be notched to receive a top edge of the monocoque, or alternatively, the post can extend a few inches above the monocoque so that the cover does not have to be notched.

As described below, the posts provide a protected enclosure for wiring and electrical connectors. The illustrated posts also provide easy access to the wiring for visual inspection and maintenance/quality-assurance/repair functions. If desired, it is contemplated that a junction box (typically a fabricated metal or thermo-plastic accessible enclosure) can be designed to attach to a post (such as to a top of the post or to a rear or front of the post) if local codes stipulate an enclosed jumper housing between adjacent monocoques. The junction box would serve as an interconnecting collection point for the wiring giving both electrical and weather protection for the system. This "junction box" will lock into the back of the posts. Also, power wiring can be run within the inner-hollow cavities of the post into and terminated within the box, thus reducing costs of electrical wiring of the system while allowing visual inspection, electrical shock prevention, and environmental protection of the completed system's wiring. Still further, the junction box can be sufficient in size to house other components, such as a telemetry sensor(s) for sensing system performance, a transmitter for transmitting system performance data to a controller/main station. A micro-inverter can also be easily installed in these boxes or on the back of the posts if the microinverters are weather-proof, permitting AC wiring of the entire system. This practice is becoming more commonly used by solar designers and the Mono-Mount™ system will accept these distributed AC inverter systems with ease by providing a variety of mounting and wiring options.

The present mounting post system can be installed over a sloping terrain often without having extensive leveling of the site required, which results in substantial cost and environmental preservation benefits. For example, site preparation is greatly reduced, and in some locations totally eliminated. It is contemplated that in many locations, post installation can be accomplished with manual "post drivers" or automated "hammer drivers" controlled by a master topography plan and located by differential-beacon GPS positioning systems. This can facilitate three-dimensional, computer-aided design of the entire system that considers the complex topography of the site, "forbidden" zones having buried utilities, or designer's aesthetic and functional requirements.

For all of the above reasons, this system provides a very competitive, low cost solution for mounting flexible PV laminates. It integrates mechanical and electrical systems for ease of installation and low total cost, while taking advantage of excellent mechanical strength of monocoques, and while providing excellent overall esthetics and safety for PV-system installations. An important part of this innovation rests in the use of curved surfaces formed from metallic, polymeric (reinforced or not) or composite materials to form monocoques, so as to rely on their curved architecture (simple or complex geometry) for a substantial contribution of required mechanical strength and reduction of costs in creating PV-solar installations.

Several variations and enhancements can be integrated into the present innovative system, as described above and below, as will be understood by persons skilled in this art and as illustrated by the following examples.

A modular solar panel system 50 (FIGS. 1-5) includes a plurality of monocoques 51 each defining a curved shape that derives strength from the curved shape for maintaining the curved shape, each including at least one solar panel or solar cell 52 on the curved shape. A plurality of posts 53 are provided, each with opposing sides configured to engage and support a vertical side edge of adjacent ones of the monocoques 51. An electrical circuit 54 includes wiring 55 that interconnects the solar panels 52 for electrical flow and power management.

Figure 8:
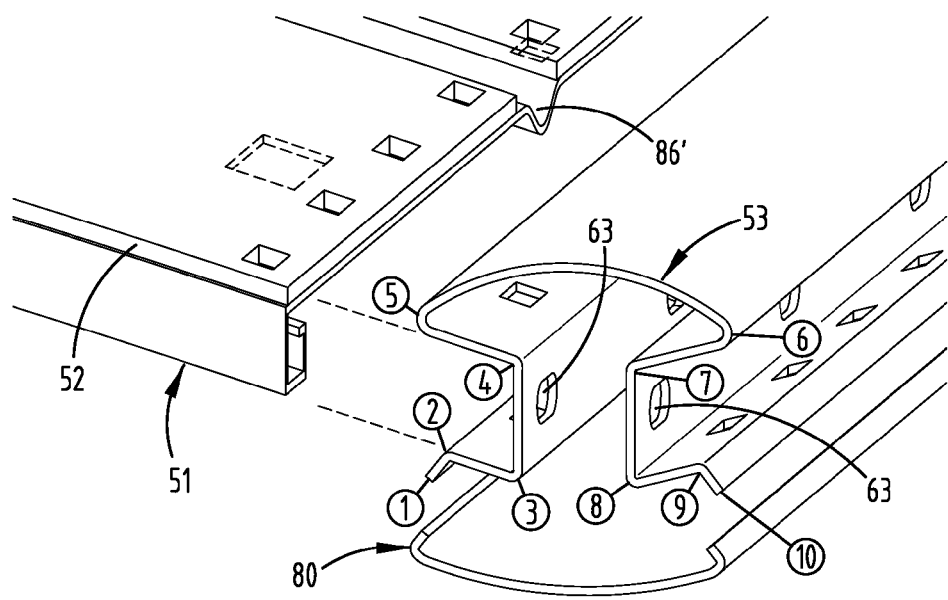
FIG. 8 is an exploded perspective view of the post and side cover in FIG. 6, similar to FIG. 6 but from a different viewpoint and also with additional post details.
Figure 9:
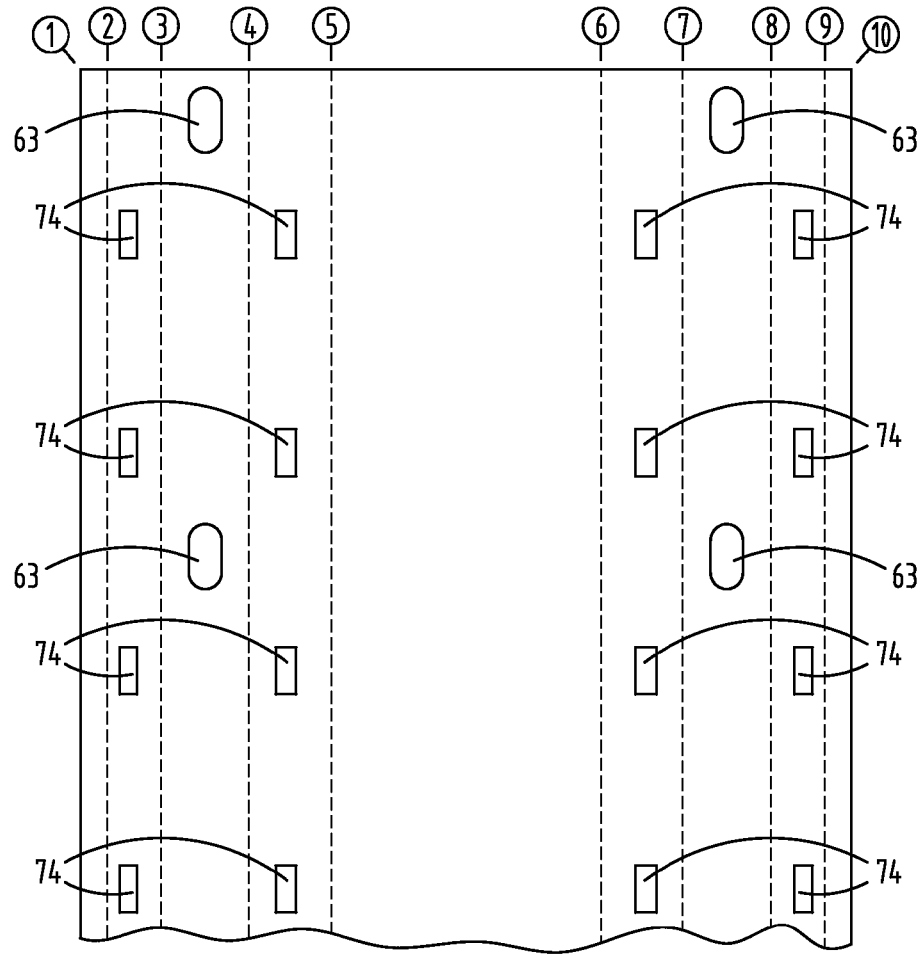
FIG. 9 is a plan view of a blank sheet of metal pre-punched with holes and ready to be roll formed into the post shown in FIGS. 5-8.
Figure 10A:
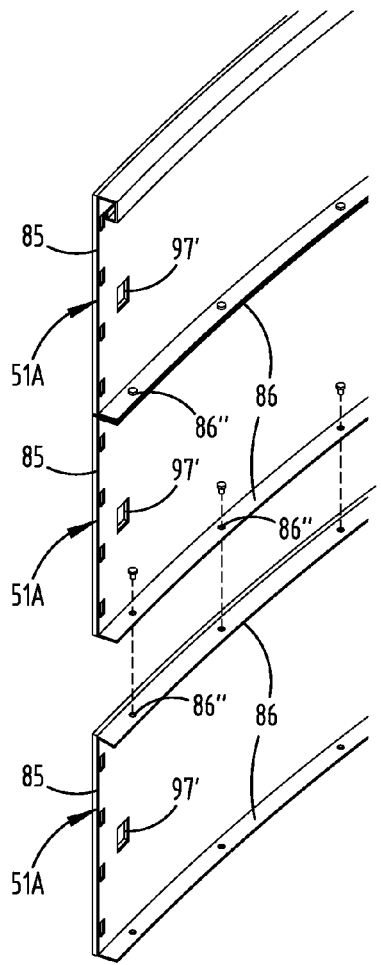
FIGS. 10C-10E are cross sections showing alternative post constructions.
Figure 10B:
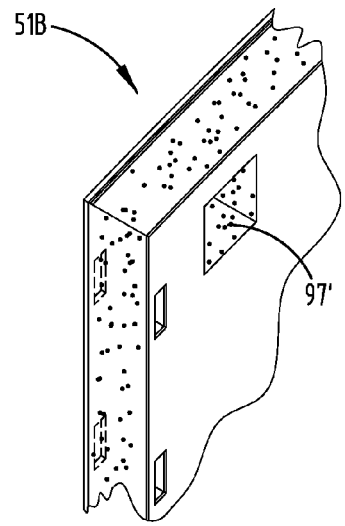
Figure 10C:
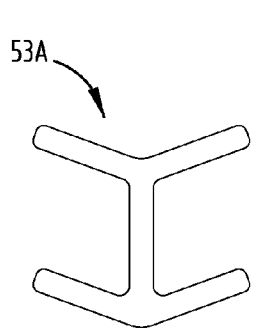
Figure 10D:
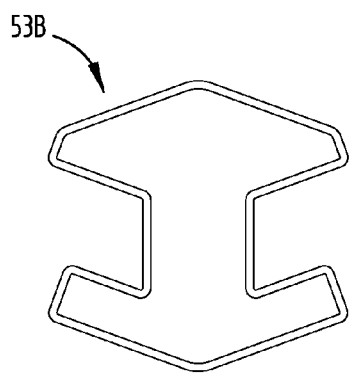
Figure 10E:
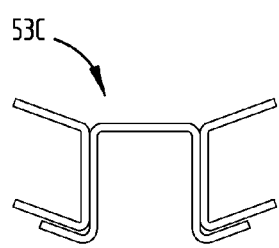
Figure 11:
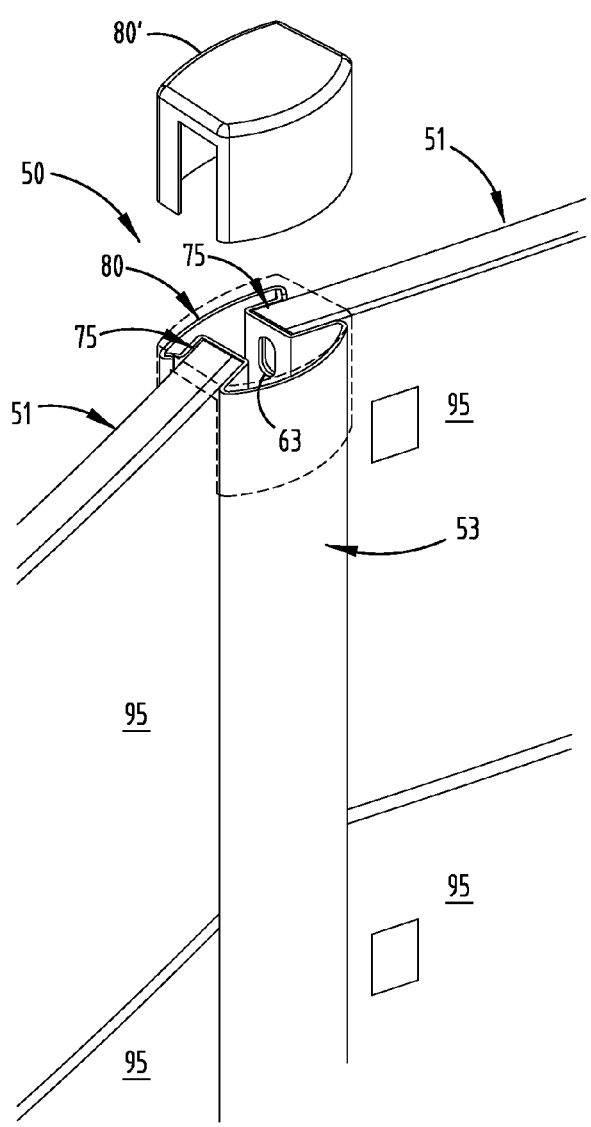
FIGS. 11-12 are perspective views showing front and rear details of the post and showing wire routing and wire storage
Figure 12:
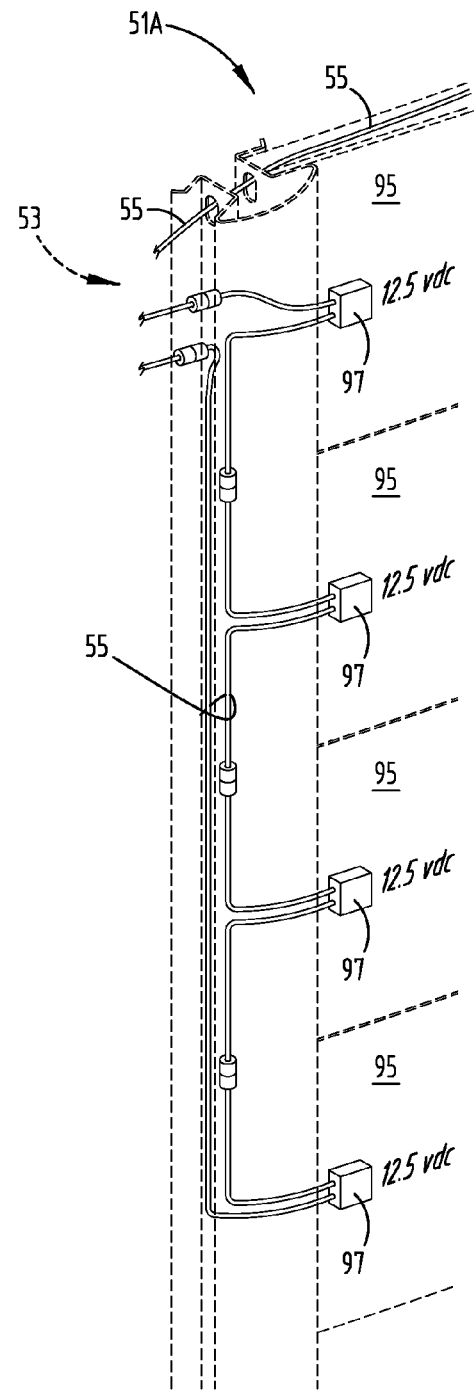
Figure 13:
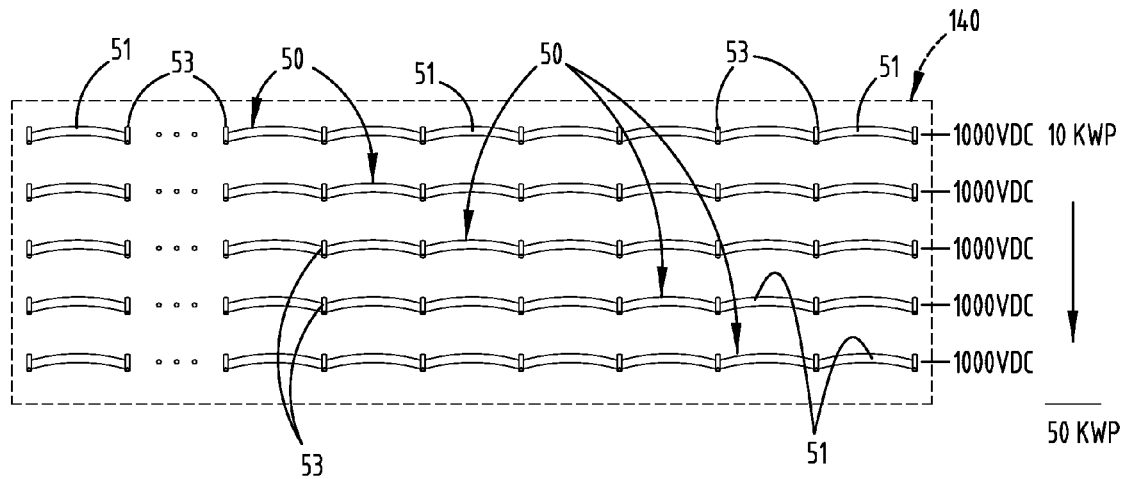
FIGS. 13-13A are schematic views showing a field installation and grid considerations.
Figure 13A:
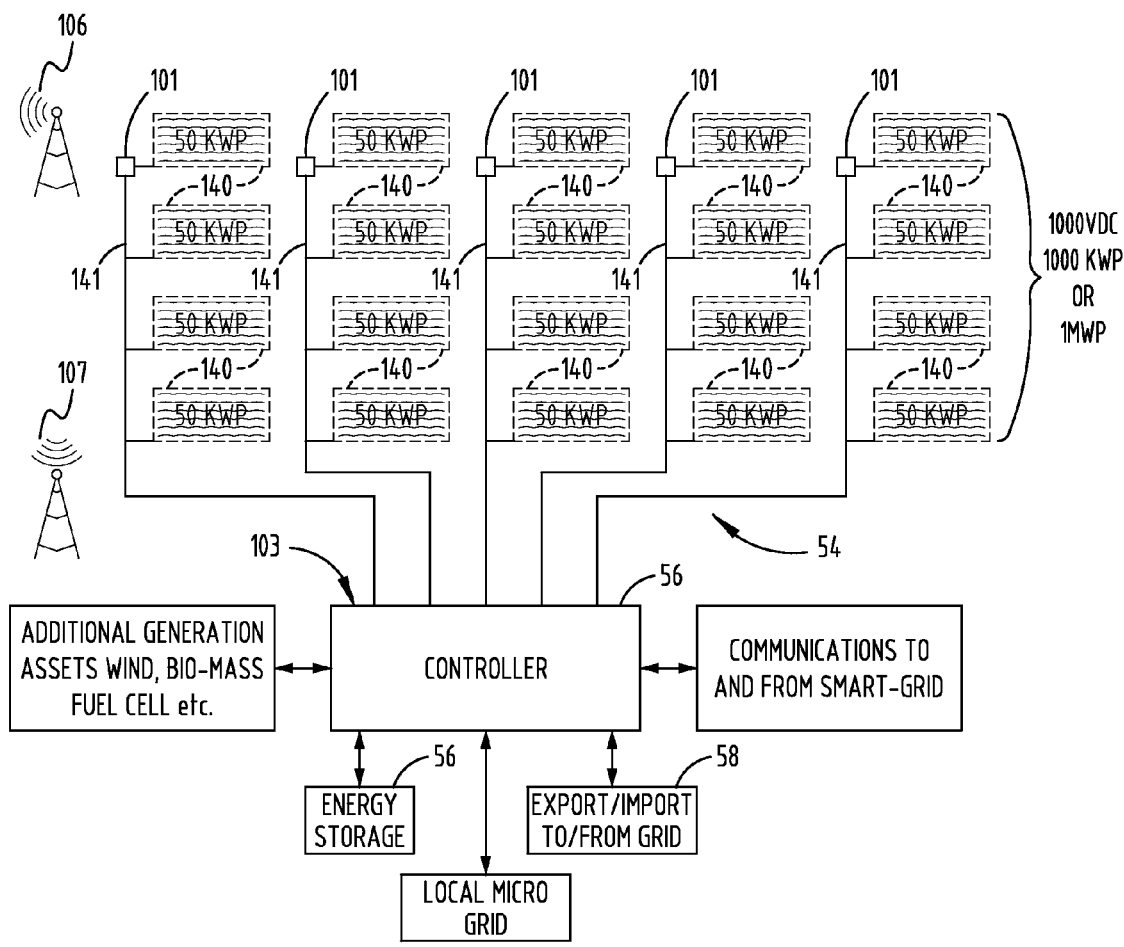
Figure 14:
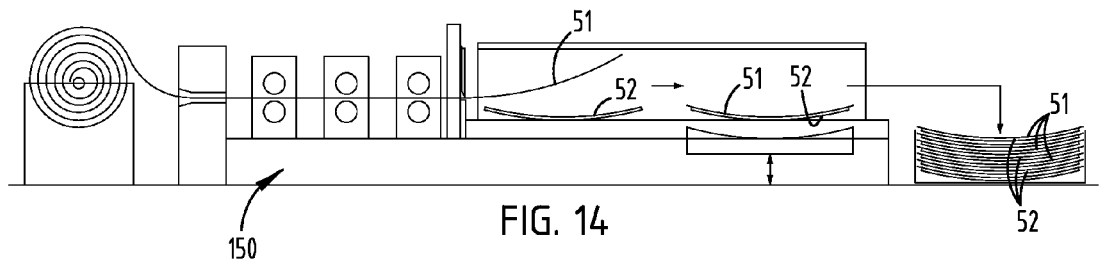
FIG. 14 is a side view of a roll-forming process for forming the illustrated monocoque.
Figure 15:
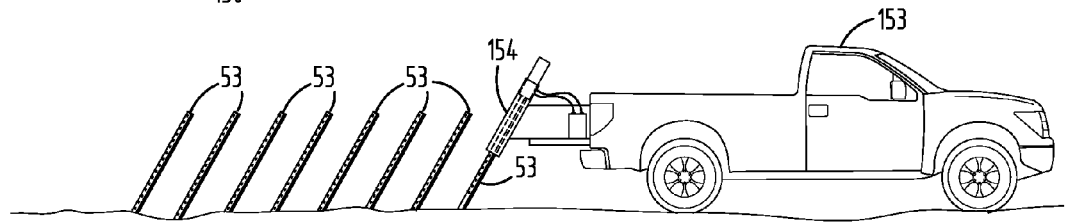
FIGS. 15-16 are side views showing a post installation method (FIG. 15) and monocoque-to-post installation method (FIG. 16).
Figure 16:
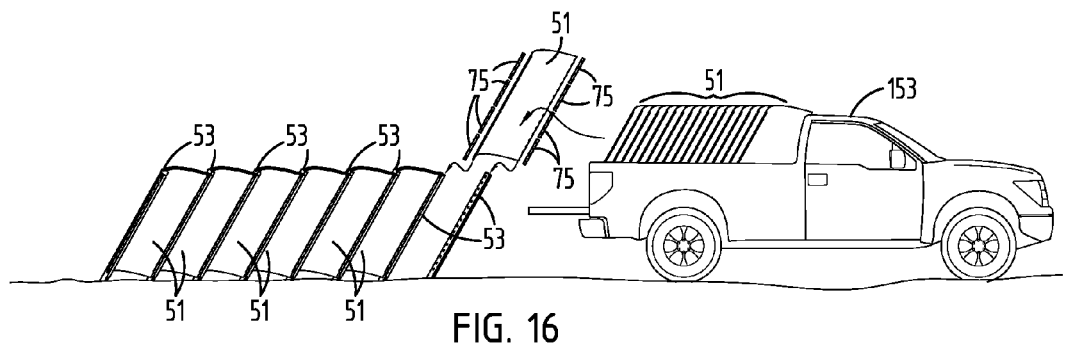
Figure 17:
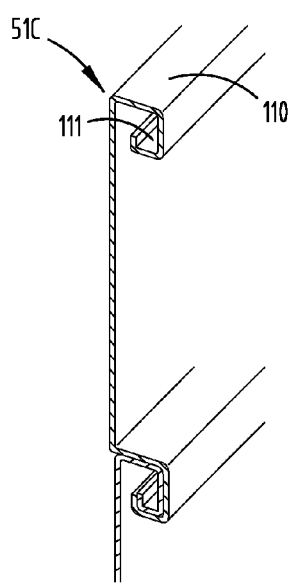
FIG. 17 is a perspective view showing a monocoque with integral wireway channel formed along its top edge, and with a mating interlocking bottom edge to join panel A and panel B.
Figure 18:
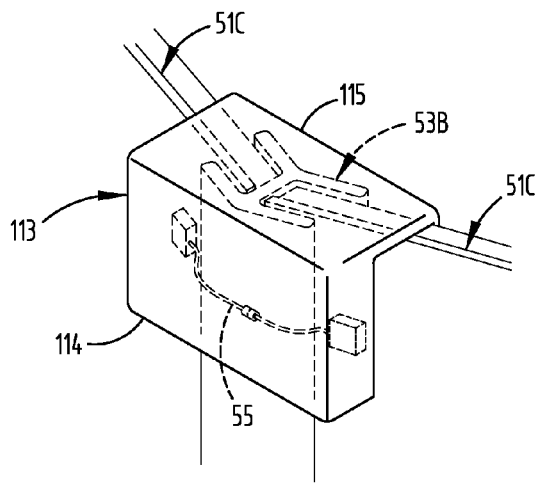
FIG. 18 is a perspective view showing a panel-to-panel jumper box for use with the wireway channel in FIG. 17.

In the description below, FIGS. 1-3 generally show an environment of an installed system 50, and FIGS. 4-7 focus on a particular illustrated monocoque 51 with solar cells 52 thereon and support by a pair of spaced posts 53. FIGS. 8-9 provide additional details of a preferred embodiment including the illustrated post 53. FIGS. 10-10B show alternative monocoque constructions, while FIGS. 10C-10E show alternative post constructions. FIGS. 11-12 show details facilitating wire routing and storage, while FIGS. 13-13A show a field installation and grid considerations for a total system. FIG. 14 illustrates a roll-forming process for forming the illustrated monocoque, while FIGS. 15-16 show a field installation methodology. FIG. 17 illustrates a panel with integral wireway channel formed therein, and FIG. 18 illustrated a panel-to-panel jumper box. FIGS. 19-22 show additional modified installations/constructions, and FIG. 23 shows an additional modified monocoque.

Figure 2:
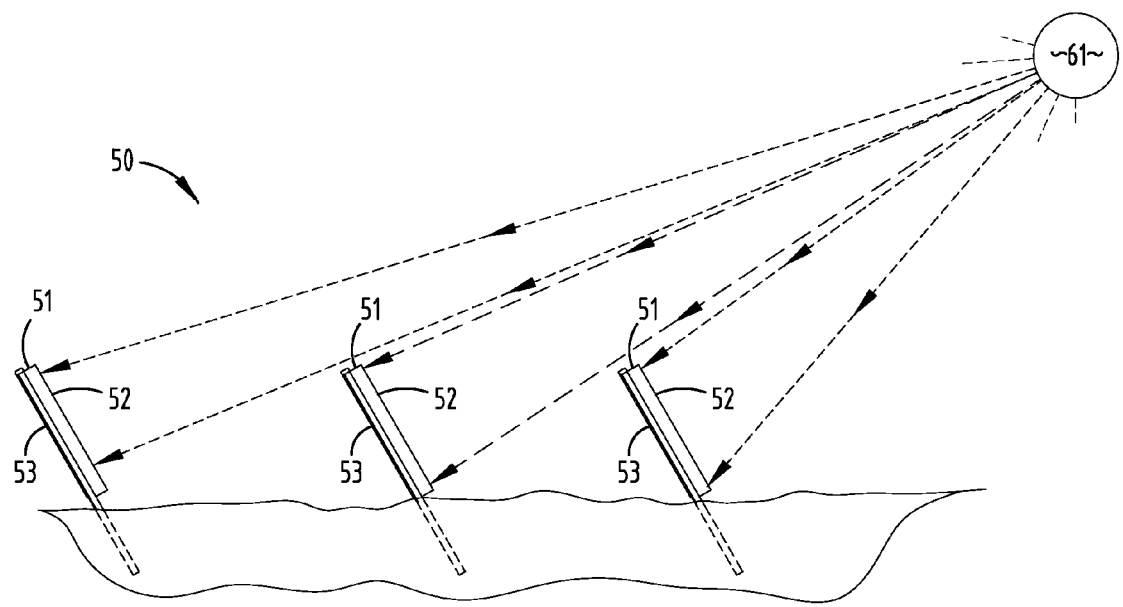
FIGS. 2-4 are side, top and rear views of a single monocoque and solar panel from FIG. 1, but with a left side of the post having brackets and the adjacent monocoque exploded away in FIG. 4.
Figure 3:
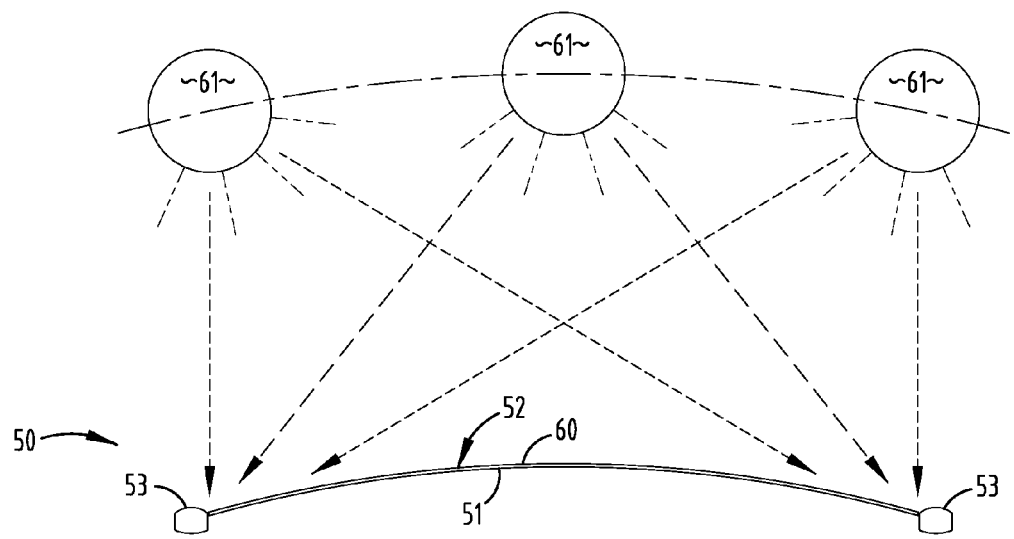
Figure 4:
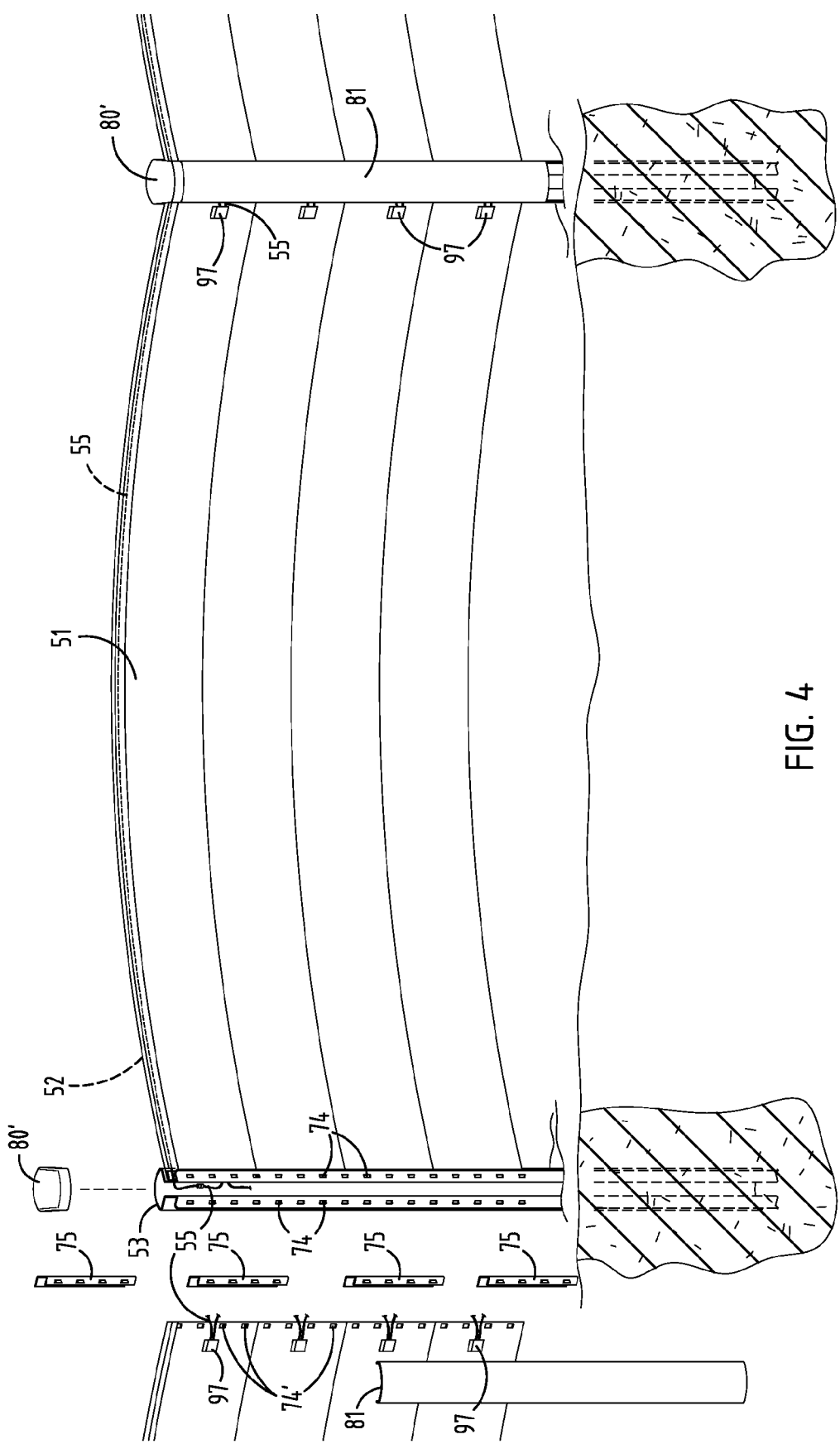
Figure 5:
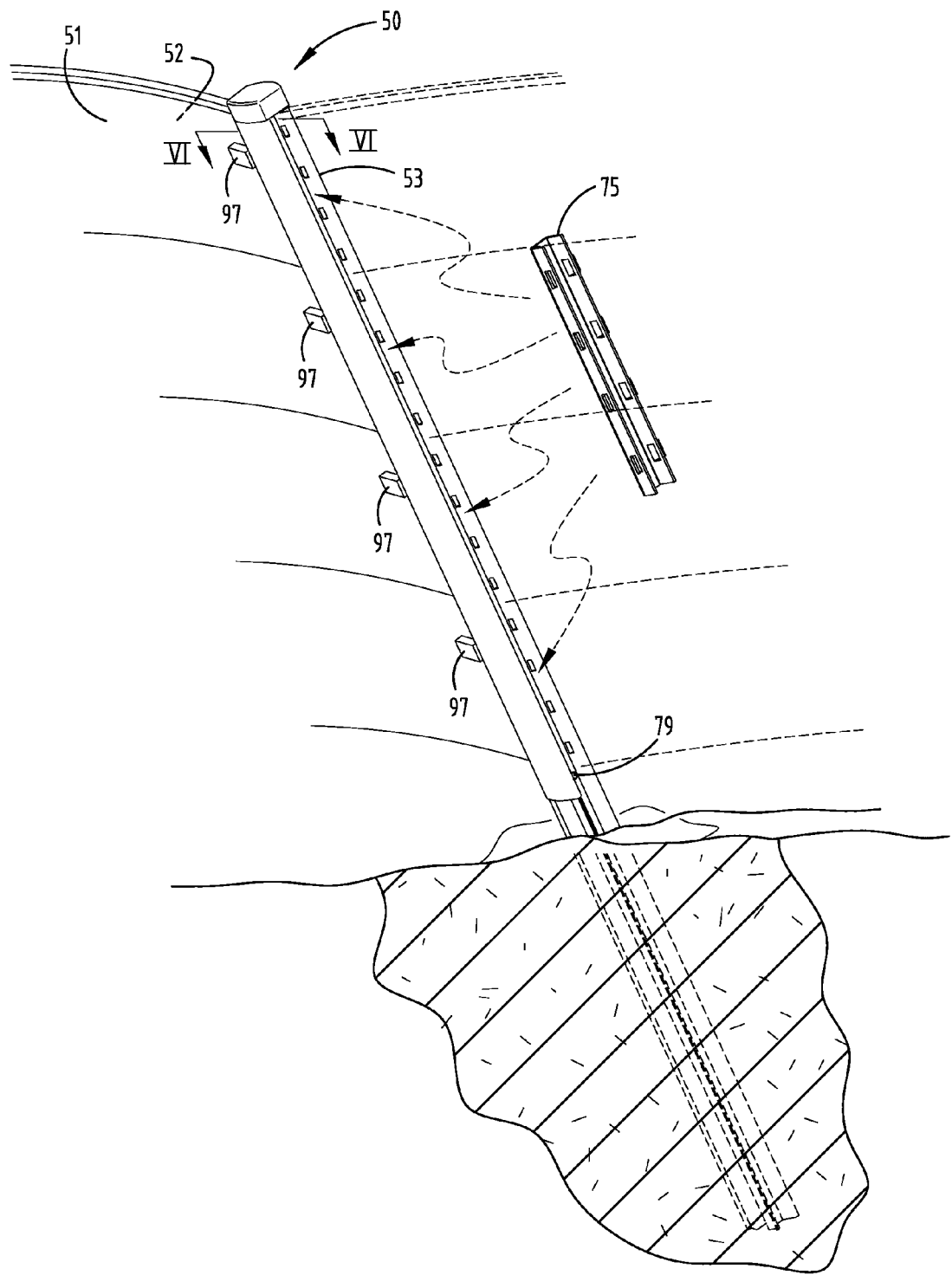
FIG. 5 is an enlarged partially-exploded view of FIG. 2.

More specifically, FIG. 1 shows the present system 50 installed in an open field with gentle slopes, with FIG. 2 showing an end view of the system and FIG. 3 showing a view generally perpendicular to a center of one of the solar panels 52. The illustrated system 50 (FIG. 1) includes 5 rows of monocoques, with 10 monocoques in each row. The advantage of placing fifty monocoques in the illustrated arrangement is discussed above and also discussed below relative to FIGS. 13-13A. However, it is noted that a particular site's designed arrangement can be in any particular pattern or arrangement desired, with more or less rows, and more or less monocoques in a given row. It is noted that the illustrated monocoques have a generally convex surface facing a desired common orientation. However, it is contemplated that the monocoques can instead have their concave surface facing toward the sun, or can be arranged to alternatingly present concave and convex surfaces along the line of monocoques. In fact, the monocoques can be arranged in any desired array. For example, it is contemplated that the monocoque orientations can be chosen based on a particular aesthetic look desired by an on-site designer/architect/landscaper. This allows a particular installation to be adapted to gentle curves of the particular landscape on which it is attached, and to accommodate different land features, such as streams, ponds, tree lines, rocks, cliffs, sharp terrain, roads, buildings, and other man-made and naturally-occurring features, while also providing a desired appearance. Anchor cables, guy wires, and/or end braces can be used to maintain the post 53 at the end of a line of monocoques 51, and also can be used periodically along a length of a line of monocoques 51 to maintain their proper angle to the sun and for support as needed.

It is specifically contemplated that the monocoques 51 can be positioned in a sinusoidal arrangement, with the curvature of each adjacent monocoque facing in an opposite direction, but with the solar panels all being on a side of each monocoque such that the solar panels face toward a sun's position. It is also contemplated that in some systems, the solar panels can be longer (or shorter) than a width of the monocoques, such that a particular solar panel bridges across a given post.

The system 50 (FIG. 1) includes the electrical circuit 54 with wiring 55 that connects the solar panels 52 to a control system including a controller 56. The control system and controller 56 are connected, programmed and configured to control electrical flow and power management, including routing electrical power to a storage device 57 or to a main electrical grid 58 for distribution of electrical power to a community or business. The system may include sensors and wireless communication connected to communicate with the controller in order to optimally control electrical flow and power.

FIGS. 2-3 illustrate the relationship of the curved support surface 60 of the monocoques 51 to the sun 61 as it tracks across a sky. It is noted that the sun 61 can be at an angle to the solar panels 52 relative to the horizon (FIG. 2) and further that a path of the sun 61 will change throughout the day (FIG. 3). It is also noted that the present monocoques 51 could be positioned in other orientations. For example, it is contemplated that a solar-panel-supporting monocoque 51 could be positioned with both of its vertical side edges resting on (or positioned close to) the ground, and with its curved middle portion arching above the ground. This arrangement might potentially be very useful on a building roof, since wind and torsional stresses would be minimized, and also mounting and anchoring would potentially be simplified.

Notably, my data and also published data shows that recent advances in solar cell technology have made solar cells effective even when the sun is not directly perpendicular to the solar cell's exterior surface. Thus, the present system is highly effective even when the sun 61 is at an early morning or late afternoon position. Further, my testing shows that operation and effectiveness of the present system is sufficient even though its angle is fixed while the angle of the sun changes from a higher position in a summer season to a lower position during a winter season.

FIGS. 4-7 focus on a particular illustrated post 53 for supporting vertical side edges of the monocoque 51 with solar cells 52 thereon. The illustrated posts 53 (FIG. 6) are roll formed from a sheet of steel or aluminum such as 2 to 6 mm thickness and 20 ksi to 80 ksi tensile strength, and also coated or treated for resistance to corrosion and degradation in outdoor elements. The illustrated post 53 includes a bulbous center section 65 and channel-forming edge sections 66 on both sides of the center section 65. The center section 65 includes a bulbous curvilinear channel body defining a vertical cavity 69 for holding wires. The edge sections 66 define a wire access slot 70 between them for access to the cavity 69. The outer edges of the center section 65 are connected to and support the edge sections 66. The edge sections 66 form oppositely/outwardly-facing U-shapes. Each edge section 66 includes first and second parallel walls 71 and 72 connected by a transverse wall 73. The posts 53 have sufficient strength such that they can be driven into the ground (FIG. 4), or can be set in concrete.

Figure 6:
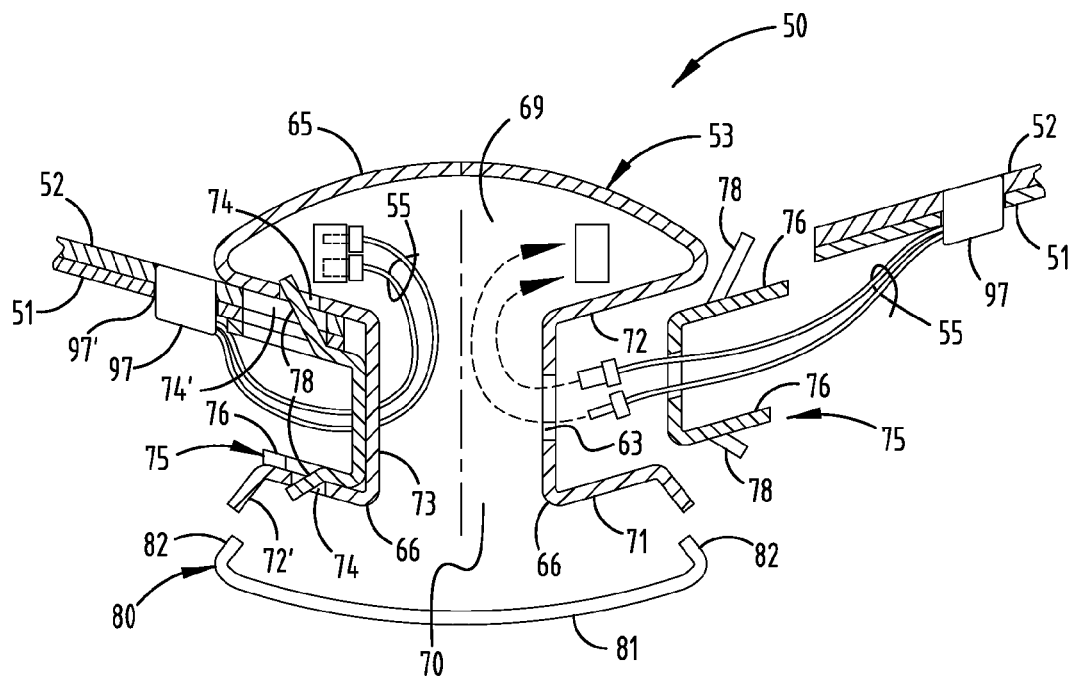
FIG. 6 is a cross section taken along line VI-VI in FIG. 5.

The walls 71 and 72 are spaced apart and include bracket-receiving attachment holes 74 (formed in the original flat blank sheet, see FIG. 9) so that the holes 74 end up in corresponding aligned positions on the walls 71 and 72 after the post 53 is roll formed (FIG. 6). An angled tip flange 72' extends at an angle from the wall 72. The bulbous center section 65 also includes wire-routing access holes 63 near the edge sections 66 (formed in the original flat blank sheet, see FIG. 9) to permit routing of wiring 55 from the solar panels 52 into the wire-holding cavity 69. Notably, the top hole 63 (FIG. 9) allows routing of wiring continuously along the channel at a top of the monocoques, while the lower holes 63 allow routing of wires into the cavity 69 of the posts. Additional holes are formed in the post as desired, such as for receiving a bottom pin for setting a height of the monocoque on the post. If desired, it is contemplated that a lower end of the post 53 can be deformed into a wedge shape or point to assist pounding the post 53 into the ground. Also, if desired, an upper end of the post 53 can be deformed to provide a better head structure for receiving impacts from a driver tool for pounding the post 53 into the ground. Alternatively, a matingly-shaped anvil head can be formed on the driving tool with a shape to engage a top of the post 53 and to distribute stress and resist deformation as the post 53 is being pounded into the ground.

A post connector 75 (also called a "locking clip" or "locking device" herein) (FIG. 7) includes an elongated U-shaped body having opposing walls 76 connected by transverse wall 77, with outwardly-extending attachment tabs 78 spaced along the opposing walls 76 and positioned to engage attachment holes 74 in the post 53 and simultaneously engage attachment holes 74' along the vertical side edges of the associated monocoque 51. The post connector 75 has a width and shape to matably wedge into the laterally-open longitudinal slot 75' (also called "laterally open channel" or "side slot") provided by the parallel walls 71 and 72 in the post 53 with the edge of the monocoque 51 also wedged therein, such that the tabs 78 resiliently flex and snap into position during installation. It is contemplated that the tabs 78 can be configured to securely engage with an audible snap, and that they can be designed to slip inside of the holes 74 and 74' to provide a level of clearance and tolerance to the assembly. The tabs 78 extend through aligned holes of the solar panels, of the vertical side edges of the monocoque, and of the posts to create a sandwich-like connection that spreads stress, and with tolerances to further reduce high stress locations.

Alternatively, a tip of the tabs 78 can be slightly angled or have an outer tip that is deformed so that the tabs 78 do not slip within the assembly, but instead, so that the tips lock into the marginal material forming the holes 74 to provide a more rigid and non-flexible assembly. It is also contemplated that push-in pins, rivets, snap fasteners, frictional stems, and other mechanical and non-mechanical fastening means can be used to secure the edges of a monocoque to a post. Notably, the elongated shape of the connector 75 forms a double thick wall of material along the post's side slot, thus adding considerably to a bending strength of the post after assembly.

A pin 79 (FIG. 5) is transversely extended through each post 53 at a bottom of the post 53 (above ground level). The pin 79 extends through the side slot in the post 53, and is configured to temporarily hold the monocoque 51 by gravity at a desired height above the ground until the post connector 75 is attached to fixedly retain the monocoque 51 to the post 53 at a desired height, as described above. By providing multiple holes, the pin 79 can be used to selectively set the monocoque 51 at different selected heights, which may be desired in some installations to compensate for geographic features, slopes, and changes in ground level. Also, the pin 79 aligns holes 74 and 74' in the post 53 and in the monocoque 51 to facilitate field assembly of the monocoques 51 to the posts 53 as the monocoques 51 are lowered into position. Notably, depending on a vertical position of the monocoques on the posts, it is contemplated that the posts can extend above a top edge of the monocoques. The top cover 80', discussed below, can be extended as necessary to cover a top of the post sufficiently for its intended purpose.

A side-of-post elongated cover 80 (FIG. 7) includes cross section having a curvilinear portion 81 and curled edges 82 forming a C-shape. The edges 82 of the cover 80 are configured to overlap and frictionally engage the angled flanges 72' on the walls 71 and 72 of the post 53, such that the cover 80 can be longitudinally assembled onto the post 53 to engage the angled tip flanges 72' so that the cover 80 closes the wire access slot 70. The cover 80 is made from a treated metal or corrosion resistant material similar to post 53, or can be made of another material such as a polymeric extrusion. By removing the cover 80, the wiring can be quickly and easily pulled through access slot 70 and inspected, and then stuffed back through the access slot 70 into the storage cavity 69, which is important in the present system. The cover 80 may be fixed by screws or another fastener if necessary to meet code requirements. A boot-like top cover or cap 80' is used to cover a top of the posts 53 and covers 80, thus maintaining closure of the wire-containing cavity 69 in the posts 53 from the weather and outdoor elements.

The monocoque 51 is made of a sheet of steel or aluminum, such as 2 mm to 6 mm thickness and 40 ksi to 80 ksi tensile strength, coated or treated for resistance to corrosion and degradation in outdoor elements. The monocoque 51 is roll formed on a continuous process and cut to length, such as to have a 6-10 foot width and 9-18 foot length, with the curvature providing a concavity of about 1-3 foot depth. Notably, systems can be constructed to have greater or lesser curvatures, greater or lesser lengths, and greater or lesser widths. Channel ribs and/or edge flanges are formed across a width of the monocoques 51 for added strength and stiffness for maintaining its formed shape. Notably, the top flange can be formed to have an up-L shape to form a continuous wireway for holding wires extending across the monocoque system. (See FIGS. 7, 8, 11, 12).

As noted above, the solar panels 52 can be flexible thin-film PV material forming multiple solar cells, such as those made by Uni Solar or other public companies, or can be small rigid tiles attached to the monocoque, such as by adhesive. As illustrated in FIG. 6, the solar panels 52 are thin film PC material adhered to the outer curved surface of the monocoque 51. This attachment can be done at the end of the roll forming process (see FIG. 14) or can be done in a secondary process, such as prior to shipping the monocoques to the field site for installation.

The monocoque 51 (FIG. 10) is made from a single sheet of material, such that it is not necessary to stack multiple monocoque sections together. However, if additional longitudinal strength and stiffness is desired, channels 86' can be rolled into the sheet, or alternatively other deformations and patterns of embossments can be formed into a body of the sheet. The illustrated monocoque 51 has a simple one-direction curvature, where the monocoque 51 includes a transverse cross section in a first direction that defines a curve and a perpendicular transverse cross section that define a straight line. However, it is contemplated that the monocoque could be complexly curved or include multiple curves or curvilinear shapes, with the curves or curvilinear shapes being formed in perpendicular cross sections.

In FIG. 6, when assembled, an edge of the monocoque 51 is held by the connector 75 in a juxtaposed abutting position against the front wall 71 of the channel-forming edge portion 66, and the wires from the solar panel 52 (which extend from a rear-facing electrical connection on a rear of the solar panel 52, and which are located in a hole in the monocoque, such that the wires extend from a rear side of the monocoque 51) extend through aligned holes in the bracket connector 75 and the post 53 into the cavity 69.

Figure 6A:
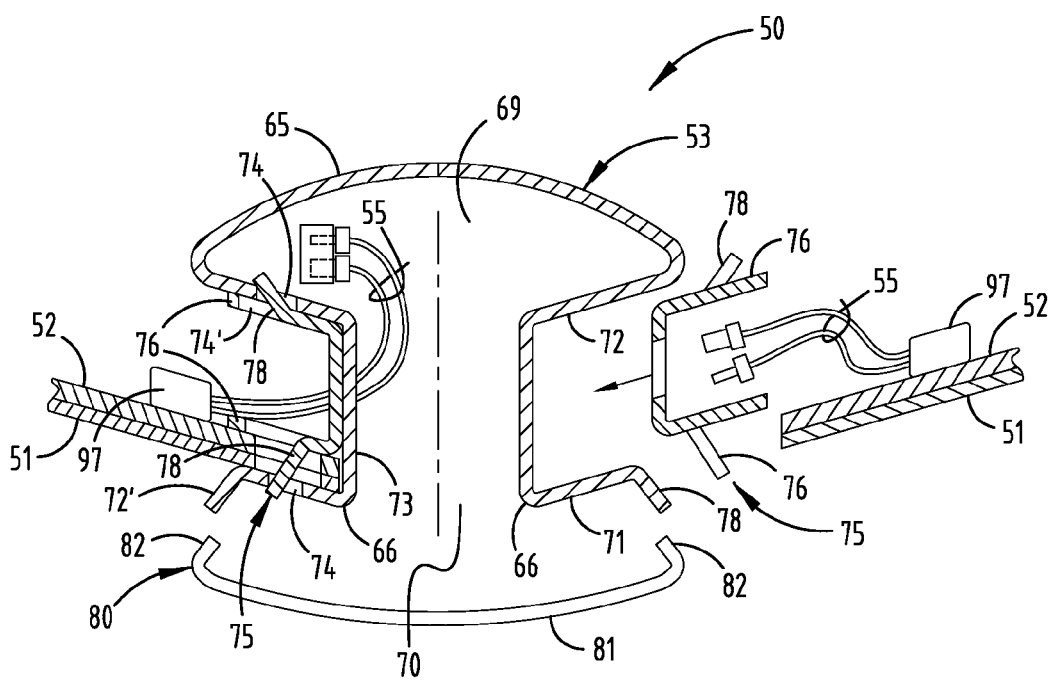
FIG. 6A is a cross section of a modified system that shows the PV material mounted at a rear of the post channel thus allowing wiring terminals to be mounted on a front face of the PV material.
Figure 7:
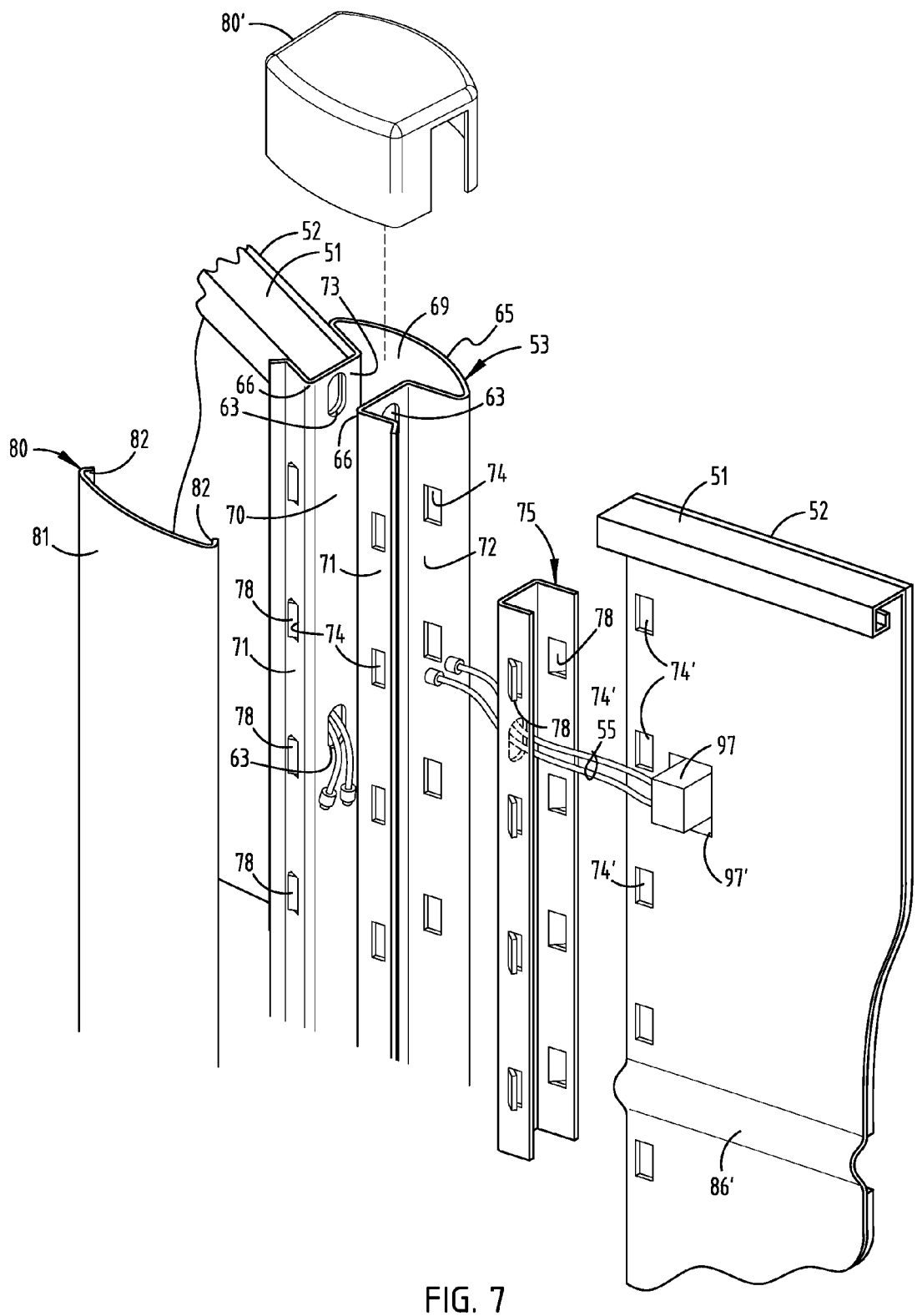
FIG. 7 is an exploded perspective view of a top of FIG. 5.

FIG. 6A shows a modification where, when assembled, an edge of the monocoque 51 is held by the connector 75 in a juxtaposed abutting position against the rearmost wall 71 of the channel-forming edge portion 66, and the wires from the solar panel 52 (which extend from a front-facing electrical connection on a front of the solar panel 52, such that the wires extend from a front side of the monocoque 51) extend through aligned holes in the bracket connector 75 and the post 53 into the cavity 69.

It is contemplated that different mechanical connecting arrangements can be made at the posts, and that the electrical wiring can be revised accordingly. For example, it is contemplated that the electrical connection could be located on a front of the solar panel 52, with wires being routed through a hole in a side of the bulbous section 65 (not specifically shown, but see FIGS. 6-6A). A rubber grommet or other means could be used in the wire routing holes to minimize the likelihood of the sheet metal of post 53 creating an electrical short in the wires. The grommet would also minimize water intrusion into the post. Notably, still other arrangements are contemplated. For example, the edge of the monocoque 51 could abut the rear wall 71 of the channel-forming edge section 66, and held in that position by the connector 75. In such circumstance, the wires would be routed through aligned holes in the connector 75 and the post wall 73, similar to the arrangement shown in FIG. 6. See also the wire routing shown in FIG. 7, and the flat blank of sheet metal with pre-pierced holes ready for roll forming. Notably, the pre-piercing could be done in-line with the roll forming operation, or in advance of the roll forming operation, or after same.

In the following descriptions, similar and identical components, features, and characteristics are identified using the same identification number but with the addition of a letter "A," "B," or etc. This is done to reduce redundant discussion.

The monocoque 51 (FIG. 10) is made from a single sheet. Contrastingly, the monocoque 51A (FIG. 10A) includes several monocoque sections 51A' each having a laterally-flat body 85 that is longitudinally curved, and each with longitudinally extending edge flanges 86 on opposite sides of the body 85. The monocoque sections 51A' can be stacked on top of each other and retained by spaced posts 53 and post connectors 75. Alternatively, the abutting flanges 86 can be attached together by welds 86', rivets, or other fasteners to make a single solid unit similar to the single-sheet monocoque 51.

The monocoque 51 and 51A are made from a single thickness of metal. The monocoque 51B (FIG. 10B) includes a foam sheet (such as one inch thick) and further includes a skin (such as paper or polymer sheet or metal or other durable sheet) with good tensile strength adhered to the front and rear of the sheet. Monocoque 51B can also include flanges, embossments, dimples, or other features formations therein if desired. Brackets can be added, and holes punched/formed as needed.

Notably, the multiple bends in the post 53 and/or the monocoque 51 (or 51A) add considerable bending strength to the post due to work hardening of the material during the roll forming process. Thus, a preferred post 53 has multiple bends, such as the bends 2-9 in FIG. 8. It may also be preferable to make its bulbous section slightly flattened for increased strength (rather than making it perfectly cylindrical), depending on functional requirements of a particular system.

FIGS. 10C-10E show alternative post constructions. Specifically, FIG. 10C illustrates a post 53A similar in shape to the post 53 and configured to receive and engage post connectors 75. Post 53A is formed by welding together three roll formed U-shaped members 90, 91, 92. The center member 90 includes parallel walls welded to a transverse wall in the outer two members 91 and 92. The outer two members 91 and 92 form pockets for receiving the post connector 75. The center member 90 forms a wire access slot and wire storage area, and includes legs shaped to engage a cover 80.

The post 53B (FIG. 10D) is tubular, and as a result has increased strength (if similar materials are used) or is lighter in weight (if thinner materials are used, while taking advantage of the strength of the tube). Notably, the post 53B will have apertures formed in it to provide access to wiring held within the tubular portion of the post 53B.

FIG. 10E illustrates an extruded post 53B that also includes opposing cavities for receiving edges of the monocoques 51 and the post connectors 75. The illustrated post 53B is extruded, and does not provide any wiring storage area. Instead, it is contemplated that a cover 80B will be attached to store the wiring therein. Alternatively, wiring can be routed along a top flange on the monocoque bent to form a wireway. (See FIG. 17.)

FIG. 10E includes a post 53C roll formed into a complete I-shaped tube. Wire storage can be located outside the tube under a cover 80C. Alternatively, wiring can be routed along a top flange on the monocoque. (See FIG. 17.)

FIGS. 11 and 12 show details of wire routing and storage. As noted, the solar panels 52 include an area of solar cells 95 and also a multi-inch wide strip 96 along their vertical side edges. Electrical terminal 97 is located in the strip 96 and includes wiring 55 extending from positive and negative ports in the terminal 97. The wiring 55 is extended through wiring access holes 63 into the post 53 (FIG. 11). When access is desired, the cover 80 is removed, and the wiring 55 pulled so that the electrical connectors 98 can be inspected/connected/repaired. Notably, the length of wires will be determined by the location of electrical connections, depending upon the arrangement of series or parallel circuit designs. It is contemplated that a person skilled in this art will be able to arrange wiring as necessary, given the horizontal and vertical wire routing capabilities of the monocoque and post systems.

FIGS. 13-13A show a field installation and grid considerations. It is contemplated that the solar panels 52 on a typical 6'×9' monocoque 51 can generate 50 vdc. (See FIG. 13.) Thus a 20 panel "fence" with solar panels connected in a series circuit can generate 1000 vdc and 10 kwp, and a five row array of 20-panel "fences" (see FIG. 1) connected in a parallel circuit arrangement would generate 1000 vdc and 50 kwp. FIG. 13A shows that this can be multiplied into a 1,000 vdc and 1000 kwp system by using a 5 by 4 array of 50 panel matrix patterns 140 connected by wires 141. It is noted that the values of 50 vdc, 1000 vdc and 1 Mwp vdc are important hurdle rates as a system is bumped up in power and voltage.

The circuit 54 for handling the power generated by the present system 50 includes wiring 141 that communicates electrical power from the solar panels 52 on each monocoque 51 to a substation 101, and additional wiring communicates the power to a central station 103 with controller 56 for controlling flow and power management. The system can include remote sensors 105 and a transmitter that transmit signals 106 to a receiver 107 on the controller 104 for providing data for power management. For example, the sensors 105 can report power generation, voltage, current problems or status, enabling the controller 104 to optimize the system by reconnecting various parts of the system to form different series or parallel circuits. Also, the controller 104 could control the system to allow for safe repair and/or maintenance.

Notably, the present system shown in FIG. 13A can become an element of a smart-grid system. This is accomplished by communicating with a utility system's operators, allowing power to be stored or dispatched to an external grid as desired.

FIG. 14 shows a roll-forming process 150 for forming the illustrated monocoque. For example, the roll forming process would use a roll forming apparatus similar to the shown in Sturrus U.S. Pat. Nos. 5,092,512 and 5,454,504. In FIG. 14, a continuous roll of metal sheet material is roll formed to have a longitudinally curved shape with channel-ribs, embossments, and edge flanges as desired for a particular solar installation. In FIG. 14, the individual monocoques 51 are cut to a desired length from the continuous rolled sheet. On a "catch" table at an end of the roll forming process, a vertical lift helps assembly flexible peel-and-stick solar PV material onto the individual monocoques 51. Alternatively, the individual monocoques can be flipped and the solar panels attached from above. Notably, flexible peel-and-stick solar PV material is commercially available, such as from Uni Solar Company, a US company. It is contemplated that the solar panel can be attached to the rolled sheet metal at an end of the roll forming process or at another station. It is noted that the rolled metal sheet material is preferably pre-punched with holes prior to the roll forming operation.

FIGS. 15-16 show an installation methodology. In particular, FIG. 15 illustrates an automated post-driving machine 153 with post driving device 154 for driving the posts 53 into the soil-type ground at a desired angle. As noted above, the machine can be controlled via GPS and/or other accurate positioning device. Where the ground is rock or other hard structure, the post holes may need to be drilled and the posts held by cement, using an eternal brace to maintain an orientation of the post until the cement cures. Surface ballasts (e.g. sand bags or rock) and/or guy wires and/or anchor cables and/or tie lines can also be used to hold the posts 53. These are particularly attractive for solar power systems used in rapid deployment situations, such as for military or emergency service operations. Notably, the posts 53 are installed at an optimal angled position relative to the position of the sun. After installing the posts 53, the monocoques 51 (including the solar panels 52) are slipped downwardly between adjacent posts 53, with the vertical side edges of each of the monocoques 51 engaging the mating laterally-open slot in the side of the posts 53. Connectors 75 are applied to fixedly retain the monocoques 51 to the posts 53.

It is contemplated that features can be incorporated into the rolled monocoques 51 and/or into the posts 53. FIG. 17 illustrates a monocoque 51C with top flange 110 rolled to form along the monocoque's top edge an overhang with an up-facing integral wireway channel 111 under the overhang. Notably, the overhang of the wireway channel 111 protects the wiring 55 from weather and outdoor elements, but also allows the wiring 55 to be easily pulled for inspection.

Depending on which style of post is used (see FIGS. 6, 10C-10F), a panel-to-panel jumper box 113 may be desired (FIG. 18). The jumper box 113 shields and protects wiring 55, yet allows the wiring 55 to be routed around the posts from monocoque to monocoque. The illustrated jumper box 113 includes a lower portion 114 continuing the wire way of channel 111 around the associated post 53, and further includes a top portion 115 forming a top cap for the associated post 53.

Figure 19:
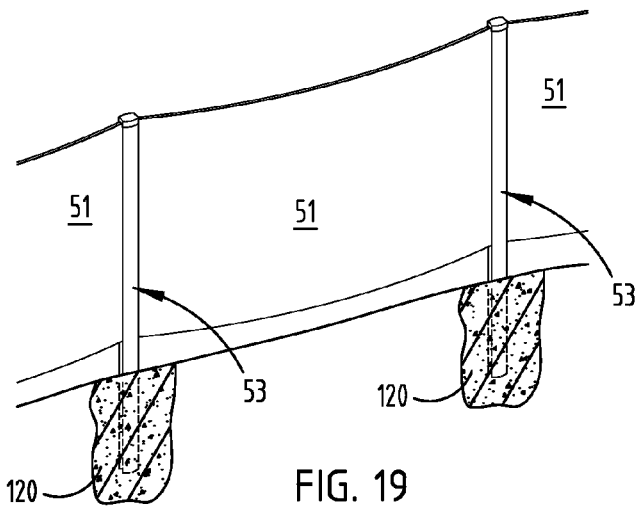
FIGS. 19-22 are perspective views showing additional modified installations/constructions.
Figure 20:
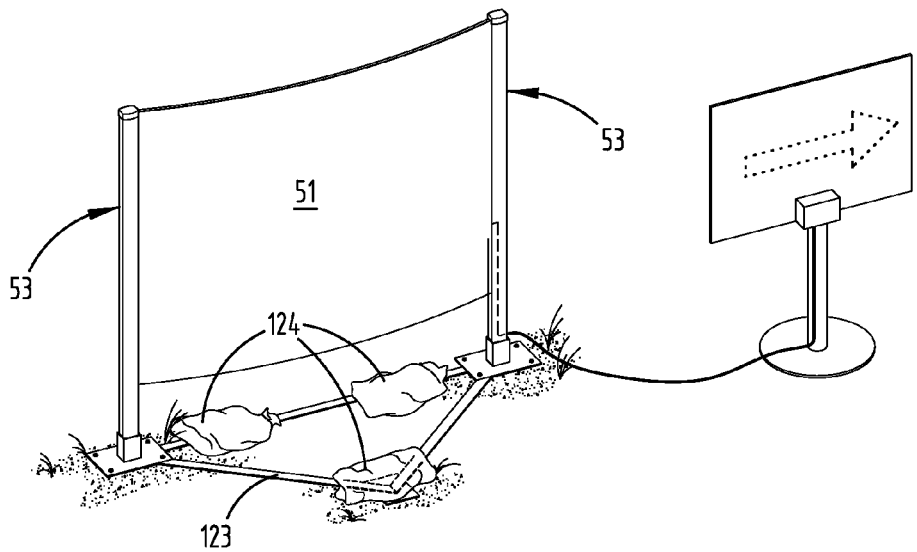
Figure 21:
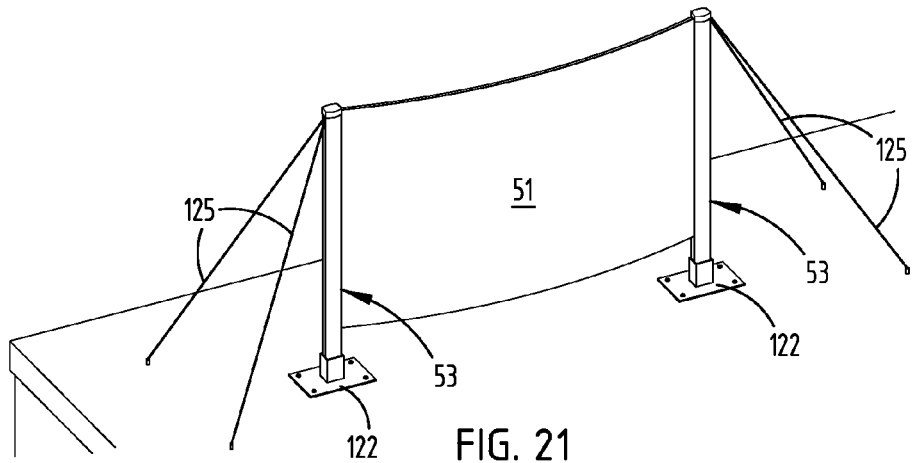

FIGS. 19-22 show additional modified installations/constructions, and in particular show a variety of different ways that the present monocoque and post system can be used. FIG. 19 includes posts 53 set in concrete foundations 120, with the monocoque 51 held in position between the posts 53. FIG. 20 includes posts 53 held upright on standards 122, with the monocoque 51 held in position between the posts 53. The standards 122 are held in spaced apart positioned by a transverse beam 123, the beam 123 being held down by sand bags 124 or other retaining means. Also angled beams extend from the transverse beam 123 to form a triangular arrangement that extends forwardly or rearwardly from the monocoque for stability. A lighted sign is connected to the solar panel and to a battery for electrical power for powering lights on the sign, thus making it a stand-alone self-charging operating sign system. FIG. 21 includes posts 53 held upright on standards 122, with the monocoque 51 held in position between the posts 53. The standards 122 are held to the ground by ground-engaging stakes, and also by anchoring cables or guy wires 125 that extend at angles from a top of the posts 53.

Figure 22:
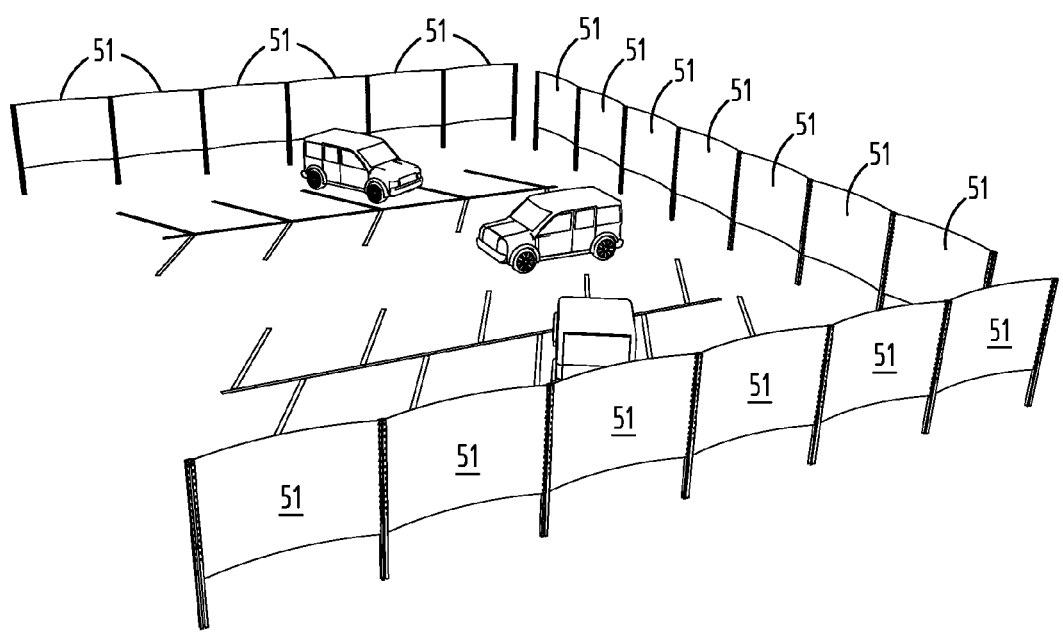
Figure 23:
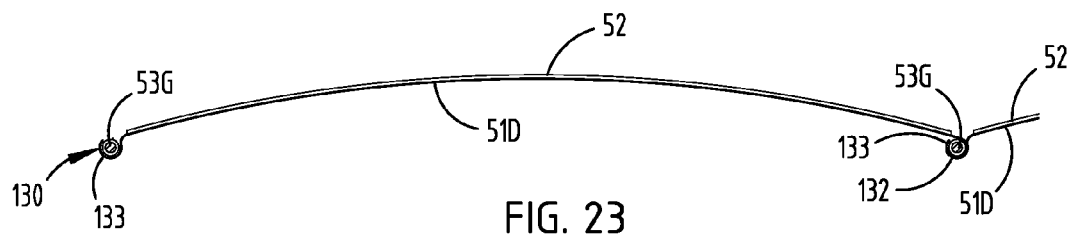
FIGS. 23-24 are top exploded and top assembled views showing an additional modified monocoque.

FIG. 22 illustrates the present system 50 with monocoques 51 and posts 53 used as a fence around a parking lot. It is contemplated that the present system 50 including a row of the monocoques 51 can be used as a visual and/or physical shield in many different environments while doubly acting as a device for generating solar power. Notably, the present system 50 is also effective even if adjacent monocoque 51 in a row face in opposite directions. In such case, the visual "fence" created would include back and forth curves along its length.

Figure 24:
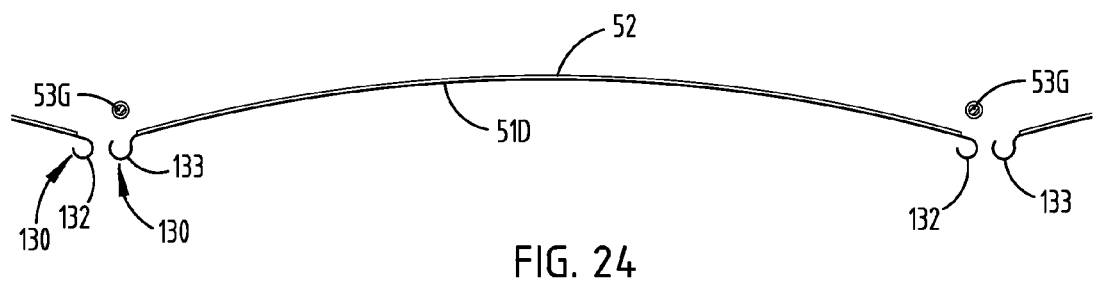

FIG. 23 (showing an assembled line of the modified system) and FIG. 24 (showing an exploded view of same) show an additional modified monocoque where a part of the post function is incorporated into the vertical side edge of the monocoque. For example, in FIG. 23, the monocoque 51D includes vertical side edges 130 and 131. The vertical side edge 130 includes a curved outer portion 132. The opposite side edge 131 includes a similar but slightly larger curved outer portion 133 that is adapted to slide telescopingly onto the first curved outer portion 132. The illustrated portions 132 and 133 have a cross section forming about 345 degrees of a circle. The posts 53D of this system are solid metal rods. It is contemplated that the vertical side edges of the monocoques could be mating non-circular shapes designed to snap together laterally, or that they can be designed as shapes that rotate into inter-engagement (similar to rotating a claw into a soft structure), or can be designed as shapes that vertically telescopingly engage.

The illustrated outer portions 132 and 133 are configured to slip onto a solid post 53D (or round tubular post). The post 53D can be driven into the ground, or can be secured to a flat plate. (See FIGS. 20 and 21.) It is contemplated that the portions 132 and 133 can be assembled onto the post first, or alternatively assembled to each other first and then slid onto the solid post 53D. It is contemplated that is some circumstances, the combination of portions 132 and 133 provide sufficient strength along the vertical side edges such that they would eliminate the need for a post. For example, see FIGS. 20 and 21, including the standards at a bottom of the drawings. It is contemplated that the standards can be a flat plate engaging the ground and having a stud of about 6 to 10 inches extending upwardly.

It is to be understood that variations and modifications can be made on the aforementioned structure without departing from the concepts of the present invention, and further it is to be understood that such concepts are intended to be covered by the following claims unless these claims by their language expressly state otherwise.

The invention claimed is:

1. A modular solar panel system comprising:
    a plurality of monocoques each defining a curved shape and each including at least one solar panel on the curved shape;
    a plurality of posts with opposing sides each engaging and supporting a vertical side edge of the monocoques; and
    an electrical circuit interconnecting the at least one solar panel on each of the monocoques for electrical flow and power management,
        wherein the posts including a bulbous center defining a cavity for wire storage and further including opposing sections configured to matably receive and be attached to and support a vertical side edge of each monocoque of the plurality of monocoques.

2. The system defined in claim 1, wherein a support structure for the system consists of the monocoques and the posts.

3. The system defined in claim 1, wherein the monocoques are made from thin sheets bent to form the curved shape and to have at least one of channel ribs and bent flanges, so that structural strength derived from the curved shape maintains the curved shape.

4. A solar panel system comprising:
    a monocoque formed from a curved panel including an exterior curved support surface facing upwardly toward the sun when in an installed position;
    an electrical circuit including a plurality of solar cells supported on the support surface and interconnected for electrical flow and power management; and
    posts including a bulbous center defining a cavity for wire storage and further including opposing sections configured to matably receive and be attached to and support a vertical side edge of the monocoque.

5. The system defined in claim 4, wherein the monocoque includes a formed sheet having a curved shape with at least one of channel ribs and bent flanges extending across the sheet to make the sheet sufficiently rigid to maintain the curved shape in the presence of wind and environmental stresses.

6. The system defined in claim 4, and wherein the monocoque is supported by the posts above ground.

7. The system defined in claim 6, wherein the posts include spaced-apart posts each supporting a vertical side edge of the monocoque and being the only support for the monocoque.

8. The system defined in claim 4, wherein the monocoque includes at least one of flanges and channel ribs in the curved panel for strength.

9. The system defined in claim 4, including a flexible solar panel having the solar cells thereon and that is adhered to the monocoque.

10. The system defined in claim 4, wherein the solar cells are part of a thin flexible photovoltaic array.

11. The system defined in claim 4, wherein the posts each include opposing sections defining channels configured to receive a vertical side edge of one of the monocoques.

12. The system defined in claim 4, wherein the opposing sections defined therebetween an access opening for the wire-storage cavity, and including a cover for closing the access opening.

13. The system defined in claim 12, including a top cap for covering a top of the posts.

14. The system defined in claim 4, wherein the posts are roll formed from a sheet on material.

15. The system defined in claim 14, wherein the sheet is pre-punched by a pre-punching operation prior to being roll formed, the pre-punching operation forming holes for passing wires through the posts after the posts are roll formed.

16. The system defined in claim 15, wherein the posts are roll formed to include oppositely facing open channels and to include a loop connecting the open channels, the holes being in a side of the loop.

17. The system defined in claim 4, wherein the monocoque includes integral flanges formed along at least one edge of the monocoque for strength.

18. The system defined in claim 4, wherein the electrical circuit includes a controller connected to the solar cells and programmed to combines electrical power from the plurality of solar cells selectively in series or in parallel for controlling power generation.

19. The system defined in claim 4, wherein the solar cells are part of a flexible solar panel adhered to the support surface.

20. The system defined in claim 4, wherein the monocoque includes a transverse cross section that defines a curve and a perpendicular transverse cross section that define a straight line.

21. A modular solar panel system comprising:
a stressed skin support structure including at least one sheet defining a curved shape where strength derived from the curved shape assists in self-maintaining the shape in at least one direction, the at least one sheet defining an enlarged outwardly-facing support surface;
a plurality of solar cells supported on the support surface; and
posts supporting opposing edges of the stressed skin support structures,
wherein the posts including a bulbous center defining a cavity for wire storage and further including opposing sections configured to matably receive and be attached to and support a vertical side edge of the stressed skin support structure.

22. The system defined in claim 21, wherein the stressed support structure includes stiffeners integrally formed in each sheet.

23. A solar panel system comprising:
a plurality of units arranged in a row with vertical side edges of adjacent pairs of the units being aligned and near each other, each unit including a stressed-sheet support structure with a curved surface between the vertical side edges, and further including at least one solar cell on the curved surface, and
a plurality of posts, each having first and second opposing surfaces engaging and supporting the first and second vertical edges of the adjacent units, respectively, whereby thermal expansion of the units is taken up by at least one of tolerances of the units and posts and/or by a change in a curvature of the units undergoing thermal dimensional change,
wherein the posts including a bulbous center defining a cavity for wire storage and further including opposing sections configured to matably receive and be attached to and support a vertical side edge of the stressed-sheet support structure.

24. The system defined in claim 23, wherein support for the stressed-sheet support structure consists of the posts.

25. A solar panel system comprising:
an alternating interconnected assembly of solar-cell-supporting monocoques and posts forming a continuous fence-simulating pattern, with each of the posts engaging adjacent vertical edges of an adjacent pair of the monocoques; the monocoques each including at least one solar-cell on a curved area of the monocoques and a circuit connected to the at least one solar cell; whereby thermal expansion of the units is taken up by at least one of tolerances of the units and posts and/or by a change in a curvature of the units undergoing thermal dimensional change,
wherein the posts including a bulbous center defining a cavity for wire storage and further including opposing sections configured to matably receive and be attached to and support a vertical side edge of the monocoque.

26. The system defined in claim 21, wherein the stressed skin support structure forms a monocoque.

27. The system defined in claim 26, wherein the stressed skin support structure includes stiffeners integrally formed in each sheet.

28. The system defined in claim 21, including a circuit connecting the solar cells and a controller controlling current flow in the circuit.

29. The system defined in claim 21, wherein the solar cells are part of a flexible solar panel.

\* \* \* \* \*